(12) United States Patent
Tamura

(10) Patent No.: US 10,020,403 B2
(45) Date of Patent: Jul. 10, 2018

(54) SEMICONDUCTOR DEVICE

(71) Applicant: Semiconductor Energy Laboratory Co., Ltd., Atsugi-shi, Kanagawa-ken (JP)

(72) Inventor: Hikaru Tamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/719,789

(22) Filed: May 22, 2015

(65) Prior Publication Data

US 2015/0348975 A1     Dec. 3, 2015

(30) Foreign Application Priority Data

May 27, 2014    (JP) ................... 2014-108707

(51) Int. Cl.
| | | |
|---|---|---|
| *H01L 29/10* | (2006.01) | |
| *H01L 29/786* | (2006.01) | |
| *H01L 27/105* | (2006.01) | |
| *H01L 27/1156* | (2017.01) | |

(52) U.S. Cl.
CPC ...... *H01L 29/7869* (2013.01); *H01L 27/1052* (2013.01); *H01L 27/1156* (2013.01)

(58) Field of Classification Search
None
See application file for complete search history.

(56) References Cited

U.S. PATENT DOCUMENTS

| | | |
|---|---|---|
| 5,430,433 A | 7/1995 | Shima |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kaneda JP201399904, English translation. 58pgs. Downloaded Apr. 8, 2016.*

(Continued)

*Primary Examiner* — David E Graybill
(74) *Attorney, Agent, or Firm* — Fish & Richardson P.C.

(57) ABSTRACT

A low-power-consuming semiconductor device that can store analog data stably and very accurately is provided at low cost. The semiconductor device includes a power supply portion, a sensor portion, and a memory element portion. The sensor portion acquires analog data. The memory element portion stores the analog data. A channel formation region of a transistor included in the memory element portion is formed in an oxide semiconductor film. The semiconductor device does not include an analog/digital converter circuit and has functions of measuring and storing analog data.

22 Claims, 10 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,343,822 B2 * | 1/2013 | Hirano ............... H01L 29/78603 257/43 |
| 8,525,172 B2 * | 9/2013 | Hirano ............... H01L 29/78603 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0009251 A1 * | 1/2006 | Noda ....................... H01Q 1/22 455/550.1 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0309180 A1 * | 12/2009 | Yamagata ............ G06K 9/0002 257/435 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0042677 A1 * | 2/2011 | Suzuki ............... H01L 29/66742 257/59 |
| 2011/0101351 A1 | 5/2011 | Yamazaki |
| 2012/0081131 A1 * | 4/2012 | Hausmann ......... G06K 7/10128 324/654 |
| 2013/0168677 A1 * | 7/2013 | Hirano ............... H01L 29/78603 257/57 |
| 2014/0121787 A1 * | 5/2014 | Yamazaki ........... H04L 12/2825 700/19 |
| 2014/0184165 A1 | 7/2014 | Takahashi et al. |
| 2015/0004762 A1 * | 1/2015 | Shimoda ............ H01L 29/7869 438/239 |
| 2015/0348975 A1 * | 12/2015 | Tamura ............... H01L 27/1052 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-128387 A | 5/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013099904 A * | 5/2013 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Sn] at Temperatures Over 1000° C", Journal of Solid State Chemistry, 1985, vol. 60, pp. 382-384.

(56) References Cited

OTHER PUBLICATIONS

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02: Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Emolying MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases For Display Application", SID Digest '07: SID International Symposium Digest of Technical Papers, 2007, vol. 38, pp. 1737-1740.

Miyasaka.M, "SUFTLA Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08: SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Sakata.J et al., "Development of 4.0-IN. AMOLED Display With Driver Circuit Using Amorphous In—Ga—Zn-Oxide TFTs", IDW '09: Proceedings of the 16th International Display Workshops, 2009, pp. 689-692.

Asaoka.Y et al., "29.1 :Polarizer-Free Reflective LCD Combined With Ultra Low-Power Driving Technology", SID Digest '09: SID International Symposium Digest of Technical Papers, May 31, 2009, pp. 395-398.

Nowatari.H et al., "60.2: Intermediate Connector With Suppressed Voltage Loss For White Tandem OLEDS", SID Digest '09: SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Lee.M et aL., "15.4:Excellent Performance of Indium-Oxide-Based Thin-Film Transistors by DC Sputtering", SID Digest '09: SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Kikuchi.H et al., "39.1:Invited Paper:Optically Isotropic Nano-Structured Liquid Crystal Composites For Display Applications", SID Digest '09: SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09: SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by AR Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08: Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

SEMICONDUCTOR DEVICE

BACKGROUND OF THE INVENTION

1. Field of the Invention

One embodiment of the present invention relates to a semiconductor device that stores data acquired by a sensor as an analog value.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

In recent years, more and more consumer devices and industrial devices are provided with sensors. Analog sensors, which can be utilized in wearable devices and in health care applications, have particularly attracted attention. Analog sensors can acquire data on temperature, pressure, acceleration, or the like. Furthermore, analog sensors can output data on change in impedance, reactance, voltage, or current, or the like as an analog value.

When data that is actually acquired is held as analog values, the data is held as it is. Analog values thus have smaller errors than digital values, which are obtained by quantization of analog values. Thus, storage and statistical analysis of analog data obtained by analog sensors make it possible to acquire comprehensive and highly accurate data on the outside world, a living body, goods, and the like.

Against such a background, semiconductor devices provided with analog sensors have been developed.

Exemplifying the above, Patent Document 1 discloses a device that acquires data on the outside world by using an analog sensor.

REFERENCE

Patent Document

[Patent Document 1] Japanese Published Patent Application No. H5-128387

SUMMARY OF THE INVENTION

Accuracy of analog data is heavily dependent on the state of a memory element storing data or the like. For example, when leakage current flows in the memory element, data deteriorates. In addition, the original state of data is changed because of heat, noise, or the like from the external environment in some cases.

With increasing use of analog sensors, an application where a plurality of analog sensors are provided or an analog sensor is thrown away after one use is expected.

In commercialization of a semiconductor device, it is important to reduce power consumption thereof and ensure high reliability.

In view of the above, an object of one embodiment of the present invention is to provide a semiconductor device that stores analog data stably and very accurately.

An object of one embodiment of the present invention is to provide a semiconductor device at low cost.

An object of one embodiment of the present invention is to reduce power consumption of a semiconductor device. An object of one embodiment of the present invention is to provide a novel semiconductor device.

Note that the objects of embodiments of the present invention are not limited to the above objects. The above objects do not disturb the existence of other objects. The other objects are objects that are not described above and will be described below. The other objects will be apparent from and can be derived as appropriate from the description of the specification, the drawings, and the like by those skilled in the art. One embodiment of the present invention achieves at least one of the above objects and the other objects.

A semiconductor device of one embodiment of the present invention includes a power supply portion, a sensor portion, and a memory element portion. The power supply portion is connected to the sensor portion and the memory element portion. The sensor portion acquires analog data. The memory element portion is connected to the sensor portion and stores the data acquired by the sensor portion. Specifically, the potential of a gate of a transistor provided in the memory element portion is controlled to perform switching operation, so that the analog data is stored.

In one embodiment of the present invention, the semiconductor device includes a first layer and a second layer, and the second layer is stacked over the first layer. The first layer includes the transistor and the second layer includes the sensor portion.

In one embodiment of the present invention, the memory element portion includes a capacitor.

In one embodiment of the present invention, the first layer includes the capacitor.

In one embodiment of the present invention, the power supply portion includes a solar cell.

In one embodiment of the present invention, a channel formation region of the transistor is formed using an oxide semiconductor film.

In one embodiment of the present invention, the semiconductor device does not include an analog/digital converter circuit but has a function of measuring and storing analog data. Note that the stored data is read out by an external circuit provided outside the semiconductor device, after the semiconductor device is collected.

One embodiment of the present invention makes it possible to provide a semiconductor device that stores analog data stably and very accurately.

One embodiment of the present invention makes it possible to provide a semiconductor device at low cost.

One embodiment of the present invention makes it possible to provide a semiconductor device with reduced power consumption. Furthermore, one embodiment of the present invention makes it possible to provide a novel semiconductor device.

Note that the effects of one embodiment of the present invention are not limited to the above effects. The above effects do not disturb the existence of other effects. The other effects are effects that are not described above and will be described below. The other effects will be apparent from and can be derived as appropriate from the description of the specification, the drawings, and the like by those skilled in the art. One embodiment of the present invention has at least one of the above effects and the other effects. Accordingly, one embodiment of the present invention does not have the above effects in some cases.

DETAILED DESCRIPTION OF THE INVENTION

Figure 1:
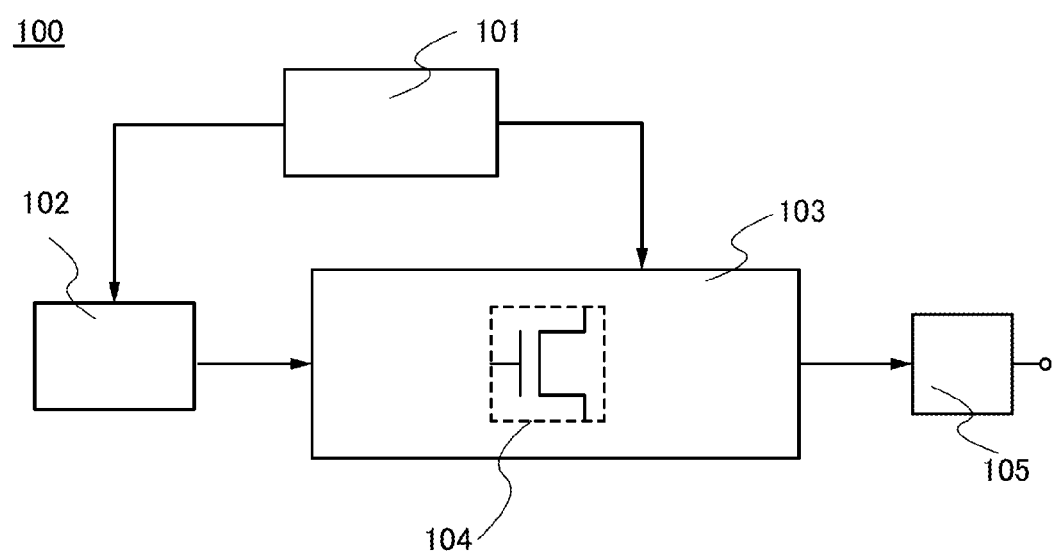
FIG. 1 is a block diagram of a semiconductor device of one embodiment of the present invention.

Hereinafter, embodiments will be described with reference to drawings. Note that embodiments can be carried out in many different modes, and it is easily understood by those skilled in the art that modes and details of the present invention can be modified in various ways without departing from the spirit and the scope of the present invention. Thus, the present invention should not be interpreted as being limited to the following description of the embodiments. Note that in the structures of the invention described below, the same portions or portions having similar functions are denoted by the same reference numerals in different drawings, and description of such portions is not repeated.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be referred to without the ordinal number in other embodiments or claims.

In this specification, terms for describing arrangement, such as "over" and "under," are used for convenience to describe the positional relation between components with reference to drawings. The positional relation between components is changed as appropriate in accordance with the direction in which each component is described. Thus, there is no limitation on terms used in this specification, and description can be made appropriately depending on the situation.

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

In this specification, the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

Note that in this specification, an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, or a layer). Accordingly, a connection relationship other than those shown in drawings and texts is also included without limitation to a predetermined connection relationship, for example, the connection relationship shown in the drawings and the texts.

Note that the term "electrical connection" includes a circuit structure in which current, voltage, or a potential can be supplied or transmitted. Accordingly, the expression "two components are connected" means not only a circuit structure in which the two components are directly connected but also a circuit structure in which the two components are electrically connected through an element such as a wiring, a resistor, a diode, or a transistor so that current, voltage, or a potential can be supplied or transmitted.

Even when independent components are connected in a circuit diagram in this specification and the like, there is the case where one conductive film has functions of a plurality of components, such as the case where part of a wiring functions as an electrode. The term "connection" in this specification also means such a case where one conductive film has functions of a plurality of components.

(Embodiment 1)

In this embodiment, an example of a semiconductor device is described. Specifically, an example of a semiconductor device that includes a power supply portion as a power source, acquires analog data in a sensor portion, and stores the data in a memory element portion is described with reference to FIG. 1.

FIG. 1 is a block diagram illustrating an example of a semiconductor device 100. The semiconductor device 100 illustrated in FIG. 1 includes a power supply portion 101, a sensor portion 102, and a memory element portion 103.

The power supply portion 101 is connected to the sensor portion 102 and the memory element portion 103. The power supply portion 101 supplies power to the sensor portion 102 and the memory element portion 103. Specifically, the power supply portion 101 includes a primary battery, a power storage device such as a capacitor or a secondary battery, or the like. As the secondary battery, a lead-acid battery, a nickel-cadmium battery, a nickel-hydride battery, or a lithium-ion battery can be used, for example. As the capacitor, an electric double layer capacitor, or a hybrid capacitor in which one of a pair of electrodes has an electric double layer structure and the other of the pair of electrodes utilizes an oxidation-reduction reaction, can be used, for example. The hybrid capacitor, for example, includes a lithium ion capacitor in which a positive electrode has an electric double layer structure and a negative electrode has a lithium ion secondary battery structure.

In the case where the power supply portion 101 includes a secondary battery, a device having a photovoltaic effect, such as a solar cell using single crystal silicon or amorphous silicon or a dye-sensitized solar cell, may be provided. Alternatively, a piezoelectric element which converts energy generated by load or motion into an electric signal by a piezoelectric effect may be provided.

The primary battery or secondary battery included in the power supply portion 101 may have flexibility to be curved or bent. In that case, a highly durable semiconductor device can be obtained.

The power supply portion 101 may include a circuit such as a DC-DC converter, a step-up circuit, or a step-down circuit. That is, the power supply portion 101 may have a function of generating a plurality of potentials. In that case, the power supply portion 101 can have a function of a power supply circuit.

The power supply portion 101 may have a function of receiving power wirelessly. That is, the power supply portion 101 may be charged with power that is supplied from outside with the use of a magnetic field, an electric field, an electromagnetic field, or the like. Therefore, the power supply portion 101 may include a rectifier circuit, a smoothing circuit, or the like.

Note that the power supply portion 101 may have another function, or may lack some of the above functions, for example. Therefore, the power supply portion 101 may be referred to simply as a circuit, or may be referred to as a first circuit, a second circuit, or the like.

The sensor portion 102 starts to operate in response to supply of power. The sensor portion 102 senses data on the environment outside the semiconductor device 100 and measures an analog value of physical quantity or chemical quantity.

The sensor portion 102 includes a sensor element. The sensor portion 102 may include a sensor circuit that controls a sensor element. As the sensor element, a resistor, a capacitive coupling element, an induction coupling element, a photovoltaic element, a photoelectric conversion element, a thermoelectric element, a transistor, a thermistor, a diode, a capacitive element, a piezoelectric element, or the like can be used. Note that a plurality of sensor elements may be provided. In this case, a plurality of physical quantities or chemical quantities can be measured and acquired.

The term "physical quantity" means temperature, pressure, flow rate, light, magnetism, sound wave, acceleration, humidity, or the like. The term "chemical quantity" means the quantity of, for example, a chemical substance such as a component included in a gas or a liquid (e.g., an ion). Other examples of a substance whose chemical quantity is subject to measurement include an organic compound such as a certain biological matter contained in blood, sweat, urine, or the like (e.g., blood sugar). In particular, in measurement of chemical quantity, a certain substance is to be detected selectively, and therefore, a substance that selectively reacts with the substance to be detected is provided in the sensor element in advance. For example, in a case of detecting a biological matter, an enzyme, an antibody molecule, a microbial cell, or the like that selectively reacts with the biological matter to be detected is preferably immobilized on a polymer or the like and provided in the sensor element.

The sensor portion 102 is connected to the memory element portion 103. Analog data acquired in the sensor portion 102 is outputted to the memory element portion 103. The memory element portion 103 includes a transistor 104, the switching of which is controlled with voltage inputted from the power supply portion 101. Specifically, switching of the transistor 104 between the on state and the off state is synchronized with operation of the sensor portion 102. The analog data outputted from the sensor portion can be stored in the memory element portion 103.

A channel formation region of the transistor 104 is formed using an oxide semiconductor. An oxide semiconductor has a wider band gap and lower intrinsic carrier density than silicon. When the oxide semiconductor is used for a transistor, the off-state current of the transistor can be significantly reduced. A transistor in which a channel formation region includes an oxide semiconductor has small temperature dependence of off-state current. Accordingly, analog data held in the memory element portion 103 can be prevented from deteriorating or changing.

By the use of the transistor 104, data can be written with low power consumption. In addition, the transistor 104 can be kept off in a standby mode of the semiconductor device of this embodiment. At that time, discharge from the memory element portion 103 can be inhibited. That is, standby power of the semiconductor device can be reduced. As a result, the stored analog data can be held for a long time. The reduction in power consumption allows a reduction in battery capacity of the power supply portion. Accordingly, the size of the semiconductor device can also be reduced.

The analog data stored in the memory element portion 103 can be outputted from an output port 105 of the semiconductor device 100 to an external circuit outside the semiconductor device. The external circuit includes an analog/digital converter circuit and converts an analog signal to a digital signal. The external circuit also performs desired processing of the digital signal and analyzes the data obtained with the sensor portion 102.

Here, the semiconductor device 100 does not include an analog/digital converter circuit. This structure can be employed because the semiconductor device 100 can hold accurate analog data with the memory element portion 103. In other words, the semiconductor device 100 may have only a function of measuring analog data and a function of storing the analog data. Accordingly, both the size and manufacturing cost of the semiconductor device 100 can be reduced. In the semiconductor device 100, no power is consumed by an analog/digital converter circuit, which enables lower power consumption. Thanks to the above effects, a semiconductor device with low power consumption and high performance can be provided at low cost.

<Modification Example>

Note that the semiconductor device 100 described above is an example of a semiconductor device of this embodiment, and a semiconductor device partly different from the above-described semiconductor device 100 is also included in this embodiment.

For example, although the transistor 104 is provided in the memory element portion 103 in the above semiconductor device 100, the semiconductor device of this embodiment is not limited to this structure. In the semiconductor device 100, the transistor 104 may be a component of the power supply portion 101 or the sensor portion 102. Furthermore, the transistor 104 is not necessarily directly connected to the power supply portion 101. The transistor 104 may be functionally connected to the memory element portion 103 through a circuit.

Furthermore, in the semiconductor device 100 described above, a structure is employed in which switching of the transistor 104 between the on state and the off state is controlled with voltage inputted from the power supply portion 101; however, the semiconductor device of this embodiment is not limited to the structure. In the semiconductor device 100 of this embodiment, switching of the transistor 104 between the on state and the off state may be controlled with a signal inputted from the sensor portion 102.

Note that the contents of this embodiment or part thereof can be combined freely with the contents of other embodiments or part thereof.

(Embodiment 2)

In this embodiment, an example of a semiconductor device is described. Specifically, an example of a semiconductor device having a plurality of sensor portions is described with reference to FIG. 2A.

Figure 2A:
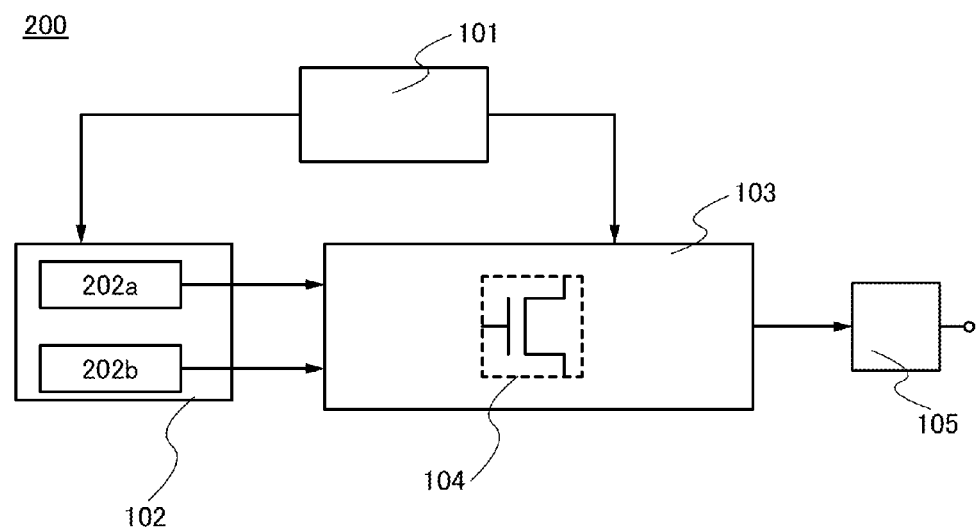
FIGS. 2A and 2B are block diagrams each illustrating a semiconductor device of one embodiment of the present invention.

FIG. 2A illustrates a semiconductor device 200 which includes the power supply portion 101, the sensor portion 102, and the memory element portion 103 and in which the sensor portion 102 includes a sensor element 202a and a sensor element 202b.

The sensor element 202a and the sensor element 202b can measure analog values of different physical or chemical quantities. For example, the sensor element 202a can measure the surrounding temperature of the semiconductor device 200 while the sensor element 202b can measure the pressure exerted on the semiconductor device 200. Data obtained with the sensor element 202a and the sensor element 202b are outputted to the memory element portion 103. The memory element portion 103 stores the obtained analog data. With the above structure, two different kinds of physical or chemical quantity can be stored as analog data, whereby a higher-performance semiconductor device can be provided.

Furthermore, data obtained with the sensor element 202a or the sensor element 202b can also be corrected with an external circuit. For example, the characteristics of the sensor element 202b that measures pressure are changed in accordance with temperature in some cases. In the semiconductor device 200 of this embodiment, the sensor element 202a and the sensor element 202b can respectively measure temperature and pressure at the same time. The measurement results are read by the external circuit afterward and correction is performed using the measured temperature, whereby pressure data with a small error can be calculated.

The channel formation region of the transistor 104 in the memory element portion 103 is formed using an oxide semiconductor.

The analog data stored in the memory element portion 103 can be outputted from the output port 105 of the semiconductor device 200 to an external circuit outside the semiconductor device. Here, the semiconductor device 200 does not include an analog/digital converter circuit. This structure can be employed because the semiconductor device 200 can hold accurate analog data with the memory element portion 103. In other words, the semiconductor device 200 may have only a function of measuring analog data and a function of storing the analog data. Accordingly, both the size and manufacturing cost of the semiconductor device 200 can be reduced. In the semiconductor device 200, no power is consumed by an analog/digital converter circuit, which enables lower power consumption. Thanks to the above effects, a semiconductor device with low power consumption and high performance can be provided at low cost.

For details about the sensor element 202a and the sensor element 202b, description of the sensor element in Embodiment 1 can be referred to.

<Modification Example>

Note that the semiconductor device 200 described above is an example of a semiconductor device of this embodiment, and a semiconductor device partly different from the above-described semiconductor device 200 is also included in this embodiment.

Although the sensor element 202a and the sensor element 202b are connected in parallel to the memory element portion 103 in FIG. 2A, the structure of the semiconductor device of this embodiment is not limited thereto. For example, the sensor element 202a and the sensor element 202b may be connected in series to the power supply portion 101 or the memory element portion 103. Alternatively, series connection and parallel connection may be combined. It is thus possible to employ a structure in which the sensor element 202a performs measurement and then the sensor element 202b operates to perform measurement. For example, the sensor element 202a measures temperature and then the sensor element 202b measures pressure. Alternatively, a structure can be employed in which the sensor element 202b starts measurement only when the sensor element 202a senses a temperature higher than or equal to a predetermined value.

Note that although two kinds of sensor elements are provided in FIG. 2A, the present invention is not limited to this structure. In one embodiment of the present invention, three or more kinds of sensor elements may be provided in the sensor portion. Alternatively, a plurality of sensor elements of the same kind may be provided.

Note that the contents of this embodiment or part thereof can be combined freely with the contents of other embodiments or part thereof.

(Embodiment 3)

In this embodiment, an example of a semiconductor device is described. Specifically, an example of a semiconductor device having an antenna is described with reference to FIG. 2B.

Figure 2B:
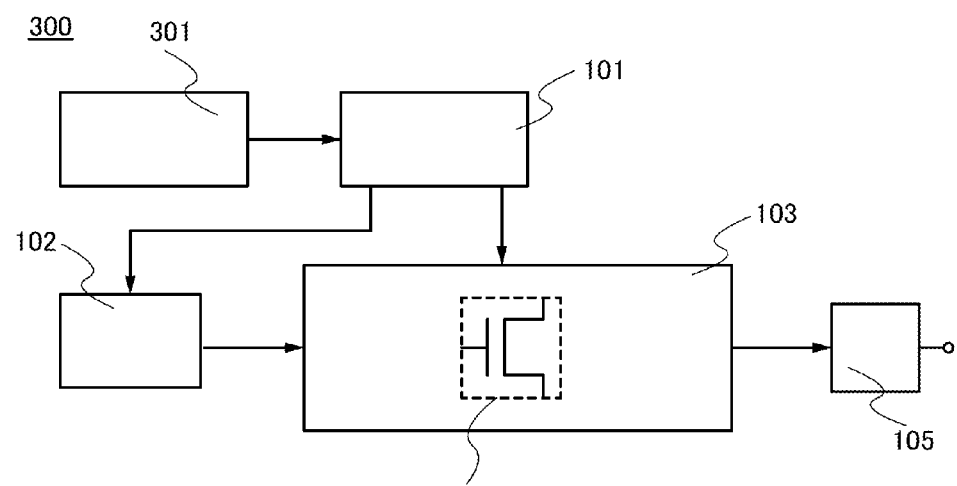

FIG. 2B illustrates a semiconductor device 300 which includes the power supply portion 101, the sensor portion 102, the memory element portion 103, and an antenna portion 301.

The antenna portion 301 is connected to the power supply portion 101. The antenna portion 301 enables charging using a power feeder provided outside the semiconductor device. For example, when an antenna in coil form provided in the power feeder and an antenna provided in the antenna portion 301 come close to each other, an AC magnetic field is produced from the antenna in coil form provided in the power feeder. The resulting electromagnetic induction produces electromotive force between terminals of the antenna provided in the antenna portion 301 (between one end and the other end of the antenna). With the electromotive force, the battery in the power supply portion 101 can be charged.

Note that the frequency of a signal transmitted from the external power feeder to the antenna portion 301 may be any of the following, for example: tremendously high frequency (from 300 GHz to 3 THz), extremely high frequency (from 30 GHz to 300 GHz), super high frequency (from 3 GHz to 30 GHz), ultra high frequency (from 300 MHz to 3 GHz), very high frequency (from 30 MHz to 300 MHz), high frequency (from 3 MHz to 30 MHz), medium frequency (from 300 kHz to 3 MHz), low frequency (30 kHz to 300 kHz), and very low frequency (from 3 kHz to 30 kHz).

The above structure enables contactless power feeding from the outside of the semiconductor device 300, and the semiconductor device can be driven for a long time. In addition, the battery provided in the power supply portion 101 is allowed to have smaller capacity. Note that when power needed for operation of the sensor portion 102 or the memory element portion 103 can be sufficiently obtained with induction voltage generated in the antenna, a structure in which the power supply portion 101 is not provided may be employed.

The sensor portion 102 starts to operate in response to supply of power. The sensor portion 102 senses data on the environment outside the semiconductor device 300 and measures an analog value of physical quantity or chemical quantity.

The channel formation region of the transistor 104 in the memory element portion 103 is formed using an oxide semiconductor.

The analog data stored in the memory element portion 103 can be outputted from the output port 105 of the semiconductor device 300 to an external circuit outside the semiconductor device. Here, the semiconductor device 300 does not include an analog/digital converter circuit. This structure can be employed because the semiconductor device 300 can hold accurate analog data with the memory element portion 103. In other words, the semiconductor device 300 may have only a function of measuring analog data and a function of storing the analog data. Accordingly, both the size and manufacturing cost of the semiconductor device 300 can be reduced. In the semiconductor device 300, no power is consumed by an analog/digital converter circuit, which enables lower power consumption. Thanks to the above effects, a semiconductor device with low power consumption and high performance can be provided at low cost.

<Modification Example>

Note that the semiconductor device 300 described above is an example of a semiconductor device of this embodiment, and a semiconductor device partly different from the above-described semiconductor device 300 is also included in this embodiment.

For example, the output port of the semiconductor device may be connected to the antenna portion 301. In that case, obtained data can be transmitted to an external circuit without contact.

Note that the contents of this embodiment or part thereof can be combined freely with the contents of other embodiments or part thereof.

(Embodiment 4)

In this embodiment, an example of a semiconductor device is described. Specifically, an example of a semiconductor device having a timer circuit is described with reference to FIG. 3A.

Figure 3A:
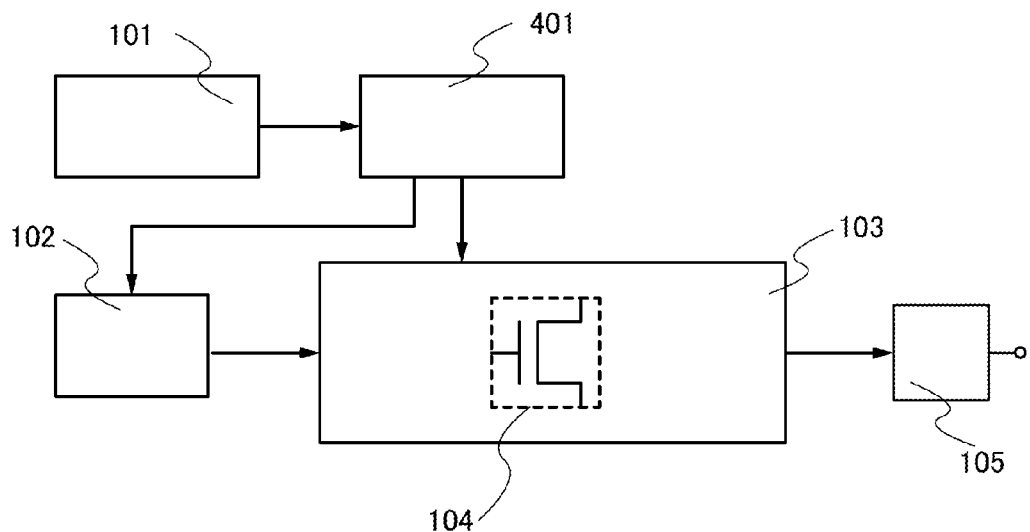
FIGS. 3A and 3B are block diagrams each illustrating a semiconductor device of one embodiment of the present invention.

FIG. 3A illustrates a semiconductor device 400 which includes the power supply portion 101, the sensor portion 102, the memory element portion 103, and a timer circuit 401.

The power supply portion 101 is connected to the timer circuit 401. The timer circuit 401 is connected to the sensor portion 102 and the memory element portion 103. The timer circuit 401 can output an operation signal to the sensor portion 102 and the memory element portion 103 at a predetermined timing. Signals may be outputted at regular intervals so that the semiconductor device 400 operates intermittently.

With the above structure, the sensor portion 102 can operate and obtained data can be stored in the memory element portion 103 at a desired timing. As a result, measurement with high time resolution can be performed using the semiconductor device 400.

The sensor portion 102 starts to operate in response to supply of power. The sensor portion 102 senses data on the environment outside the semiconductor device 400 and measures an analog value of physical quantity or chemical quantity.

The channel formation region of the transistor 104 in the memory element portion 103 is formed using an oxide semiconductor.

The analog data stored in the memory element portion 103 can be outputted from the output port 105 of the semiconductor device 400 to an external circuit outside the semiconductor device. Here, the semiconductor device 400 does not include an analog/digital converter circuit. This structure can be employed because the semiconductor device 400 can hold accurate analog data with the memory element portion 103. In other words, the semiconductor device 400 may have only a function of measuring analog data and a function of storing the analog data. Accordingly, both the size and manufacturing cost of the semiconductor device 400 can be reduced. In the semiconductor device 400, no power is consumed by an analog/digital converter circuit, which enables lower power consumption. Thanks to the above effects, a semiconductor device with low power consumption and high performance can be provided at low cost.

<Modification Example>

Note that the semiconductor device 400 described above is an example of a semiconductor device of this embodiment, and a semiconductor device partly different from the above-described semiconductor device 400 is also included in this embodiment.

The timer circuit 401 may output an operation signal to only one of the sensor portion 102 and the memory element portion 103. For example, a structure can be employed in which the sensor portion 102 performs measurement for a predetermined time to accumulate data and then operation of the memory element portion 103 is controlled with the timer circuit 401.

Note that the contents of this embodiment or part thereof can be combined freely with the contents of other embodiments or part thereof.

(Embodiment 5)

In this embodiment, an example of a semiconductor device is described. Specifically, an example of a semiconductor device having an amplifier is described with reference to FIG. 3B.

Figure 3B:
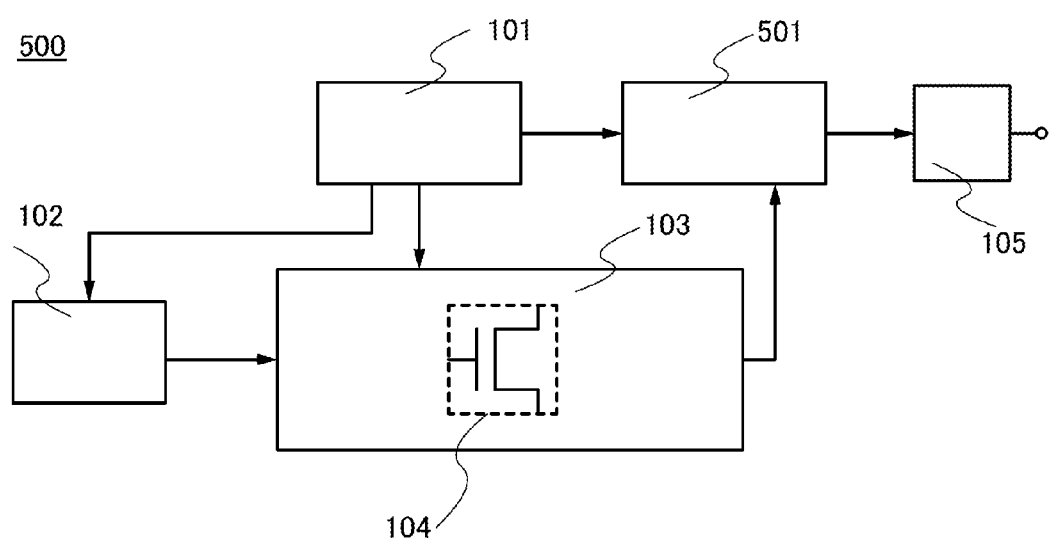

FIG. 3B illustrates a semiconductor device 500 which includes the power supply portion 101, the sensor portion 102, the memory element portion 103, and an amplifier 501.

The power supply portion 101 is connected to the sensor portion 102, the memory element portion 103, and the amplifier 501. The power supply portion 101 supplies power to the sensor portion 102, the memory element portion 103, and the amplifier 501.

The amplifier 501 can amplify the potential outputted from the memory element portion 103. An analog signal stored in the memory element portion 103 is amplified by the amplifier 501 and then outputted from the output port 105 to an external circuit outside the semiconductor device. Accordingly, even when a value of voltage outputted from the memory element portion 103 is small, an accurate signal can be transmitted to the external circuit.

As the amplifier 501, an operational amplifier can be used. Alternatively, any of the following amplifiers can be selected appropriately, for example: a differential amplifier, an instrumentation amplifier, a unity gain amplifier, and a programmable gain amplifier. The amplification factor of the amplifier is preferably determined in consideration of the granularity of the signal, the resolution of an analog/digital converter circuit used in the external circuit, or the like.

The sensor portion 102 starts to operate in response to supply of power. The sensor portion 102 senses data on the environment outside the semiconductor device 500 and measures an analog value of physical quantity or chemical quantity.

The channel formation region of the transistor 104 in the memory element portion 103 is formed using an oxide semiconductor.

The analog data stored in the memory element portion 103 can be outputted from the output port 105 of the semiconductor device 500 to an external circuit outside the semiconductor device. Here, the semiconductor device 500 does not include an analog/digital converter circuit. This structure can be employed because the semiconductor device 500 can hold accurate analog data with the memory element portion 103. In other words, the semiconductor device 500 may have only a function of measuring analog data and a function of storing the analog data. Accordingly, both the size and manufacturing cost of the semiconductor device 500 can be reduced. In the semiconductor device 500, no power is consumed by an analog/digital converter circuit, which enables lower power consumption. Thanks to the above effects, a semiconductor device with low power consumption and high performance can be provided at low cost.

<Modification Example>

Note that the semiconductor device 500 described above is an example of a semiconductor device of this embodiment, and a semiconductor device partly different from the above-described semiconductor device 500 is also included in this embodiment.

The amplifier 501 may include a transistor in which a channel formation region includes an oxide semiconductor as described above. In that case, the memory element portion 103 and the transistor included in the amplifier 501 can be formed in the same process. Therefore, cost reduction in manufacturing the semiconductor device can be achieved.

Note that the contents of this embodiment or part thereof can be combined freely with the contents of other embodiments or part thereof.

(Embodiment 6)

In this embodiment, an oxide semiconductor (hereinafter also referred to as an oxide semiconductor film) used in the semiconductor device of the present invention is described.

A highly purified oxide semiconductor obtained by a reduction of impurities such as moisture or hydrogen serving as electron donors (donors) and a reduction of oxygen vacancies is an intrinsic (i-type) semiconductor or a substantially i-type semiconductor. For this reason, a transistor having a channel formation region in a highly purified oxide semiconductor film has extremely low off-state current and high reliability.

Specifically, various experiments prove a low off-state current of a transistor having a channel formation region in a highly purified oxide semiconductor film. For example, the off-state current of even an element having a channel width of $1\times10^6$ μm and a channel length of 10 μm can be less than or equal to the measurement limit of a semiconductor parameter analyzer, that is, less than or equal to $1\times10^{-13}$ A at a voltage between source and drain electrodes (a drain voltage) of higher than or equal to 1 V and lower than or equal to 10 V. In this case, it can be seen that off-state current standardized on the channel width of the transistor is lower than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that when the voltage between the source and drain electrodes of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor including crystalline silicon.

Here, the channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate.

When an oxide semiconductor film is used for the channel formation region of the transistor, the oxide semiconductor preferably contains at least indium (In) or zinc (Zn). Furthermore, as a stabilizer for reducing variations in electrical characteristics of transistors using the oxide semiconductor, the oxide semiconductor preferably contains gallium (Ga), tin (Sn), hafnium (Hf), aluminum (Al), and/or zirconium (Zr) in addition to indium (In) and/or zinc (Zn).

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Furthermore, unlike in the case of using silicon carbide, gallium nitride, or gallium oxide, with the use of the In—Ga—Zn-based oxide, transistors with excellent electrical characteristics can be formed over a glass substrate, and a larger substrate can be used.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Ce—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide means an oxide containing In, Ga, and Zn, and there is no limitation on the ratio of In, Ga, and Zn. Furthermore, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, high mobility can be obtained relatively easily with an In—Sn—Zn-based oxide. However, even with an In—Ga—Zn-based oxide, the mobility can be increased by a reduction in the defect density in a bulk.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region and which is entirely amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, it is difficult to observe a boundary between crystal parts, that is, a grain boundary clearly. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects a surface over which the CAAC-OS film is formed (hereinafter a surface over which the CAAC-OS film is formed is referred to as a formation surface) or a top surface of the CAAC-OS film, and is arranged parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the observation of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2 θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2 θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2 θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2 θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis of the crystal might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, the crystallinity in a region to which the impurity is added is changed, and the crystallinity in the CAAC-OS film may vary depending on regions.

When the CAAC-OS film with an $InGaZnO_4$ crystal is analyzed by an out-of-plane method, a peak of 2 θ may also be observed at around 36°, in addition to the peak of 2 θ at around 31°. The peak of 2 θ at around 36° indicates that a crystal having no c-axis alignment is included in part of the CAAC-OS film. It is preferable that in the CAAC-OS film, a peak of 2 θ appear at around 31° and a peak of 2 θ not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The CAAC-OS film is preferably deposited under the following conditions.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the sputtered particle reaches the substrate, migration occurs on the substrate, so that a flat plane of the sputtered particle is attached to the substrate.

It is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of a target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature of higher than or equal to 1000° C. and lower than or equal to 1500° C. Note that X, Y, and Z are each a given positive number. Here, the predetermined molar ratio of $InO_X$ powder to $GaO_Y$ powder to $ZnO_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not an element included in an oxide semiconductor and thus is an impurity. Likewise, alkaline earth metal is an impurity when the alkaline earth metal is not a component of the oxide semiconductor. When an insulating film in contact with an oxide semiconductor film is an oxide, Na, among the alkali metals, diffuses into the insulating film and becomes $Na^+$. Furthermore, in the oxide semiconductor film, Na cuts or enters a bond between metal and oxygen which are components of the oxide semiconductor. As a result, the electrical characteristics of the transistor deteriorate; for example, the transistor is placed in a normally-on state because of a negative shift of the threshold voltage or the mobility is decreased. In addition, the characteristics of transistors vary. Specifically, the Na concentration measured by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measured Li concentration is preferably $5 \times 10^{15}/cm^3$ or lower, further preferably $1 \times 10^{15}/cm^3$ or lower. Similarly, the measured K concentration is preferably $5 \times 10^{15}/cm^3$ or lower, further preferably $1 \times 10^{15}/cm^3$ or lower.

In the case where metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using alkali metal or alkaline earth metal. Thus, the concentrations of silicon and carbon in the oxide semiconductor film are preferably low. Specifically, the C concentration or the Si concentration measured by secondary ion mass spectrometry is preferably $1 \times 10^{18}/cm^3$ or lower. In this case, the deterioration of the electrical characteristics of the transistor can be prevented, so that the reliability of a semiconductor device can be improved.

A metal in the source and drain electrodes might extract oxygen from the oxide semiconductor film depending on a conductive material used for the source and drain electrodes. In such a case, regions of the oxide semiconductor film in contact with the source and drain electrodes become n-type regions because of the formation of an oxygen vacancy.

The n-type regions serve as source and drain regions, resulting in a decrease in the contact resistance between the oxide semiconductor film and the source electrode or the drain electrode. Accordingly, the formation of the n-type regions increases the mobility and on-state current of the transistor, which achieves high-speed operation of a switch circuit using the transistor.

Note that the extraction of oxygen by a metal in the source and drain electrodes is probably caused when the source and drain electrodes are formed by sputtering or when heat treatment is performed after the formation of the source and drain electrodes.

The n-type regions are more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film that contains at least one of the metal elements contained in the second metal oxide film and whose energy at the bottom of the conduction band is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Furthermore, the second metal oxide film preferably contains at least indium in order to increase the carrier mobility.

In the transistor including the above semiconductor film, when a voltage is applied to the gate electrode so that an electric field is applied to the semiconductor film, a channel region is formed in the second metal oxide film whose energy at the bottom of the conduction band is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, resulting in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Furthermore, a plurality of metal oxide films are preferably stacked so that an interface level that inhibits carrier flow is not formed at the interface between the metal oxide films due to an impurity existing between the metal oxide films. This is because if an impurity exists between the stacked metal oxide films, the continuity of the energy at the bottom of the conduction band between the metal oxide films is lost, and carriers are trapped or disappear by recombination in the vicinity of the interface. By reducing an impurity existing between the films, a continuous junction (here, particularly a U-shape well structure with the energy at the bottom of the conduction band changed continuously between the films) is formed more easily than the case of merely stacking a plurality of metal oxide films that contain at least one common metal as a main component.

In order to form such a continuous junction, the films need to be stacked successively without being exposed to the air by using a multi-chamber deposition apparatus (sputtering apparatus) provided with a load lock chamber. Each chamber of the sputtering apparatus is preferably evacuated to a high vacuum (to approximately $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas has a dew point of −40° C. or lower, preferably −80° C. or lower, further preferably −100° C. or lower and is highly purified, moisture and the like can be prevented from entering the oxide semiconductor film as much as possible.

Specifically, when the second metal oxide film is an In-M-Zn oxide film (M is Ga, Y, Zr, La, Ce, or Nd) and a target having an atomic ratio of metal elements of In:M:Zn=$x_1$:$y_1$:$z_1$ is used to form the second metal oxide film, $x_1/y_1$ ranges preferably from ⅓ to 6, further preferably from 1 to 6, and $z_1/y_1$ ranges preferably from ⅓ to 6, further preferably from 1 to 6. Note that when $z_1/y_1$ ranges from 1 to 6, a CAAC-OS film is likely to be formed as the second metal oxide film. Typical examples of the atomic ratio of In to M to Zn in the target are 1:1:1 and 3:1:2.

Specifically, when the first and third metal oxide films are each an In-M-Zn oxide film (M is Ga, Y, Zr, La, Ce, or Nd) and a target used for depositing the first and third metal oxide films has an atomic ratio of metal elements of In:M:Zn=$x_2$:$y_2$:$z_2$, $x_2/y_2 < x_1/y_1$ is satisfied and $z_2/y_2$ ranges preferably from ⅓ to 6, further preferably from 1 to 6. Note that when $z_2/y_2$ ranges from 1 to 6, CAAC-OS films are likely to be formed as the first and third metal oxide films. Typical examples of the atomic ratio of In to M to Zn in the target are 1:3:2, 1:3:4, 1:3:6, and 1:3:8.

The first and third metal oxide films each have a thickness of 3 nm to 100 nm, preferably 3 nm to 50 nm. The second metal oxide film has a thickness of 3 nm to 200 nm, preferably 3 nm to 100 nm, further preferably 3 nm to 50 nm.

In the three-layer semiconductor film, each of the first to third metal oxide films can be amorphous or crystalline. Note that the second metal oxide film in which a channel region is formed is preferably crystalline, in which case the transistor can have stable electrical characteristics.

Note that a channel formation region means a region of a semiconductor film of a transistor that overlaps with a gate electrode and is located between a source electrode and a drain electrode. Furthermore, a channel region means a region through which current mainly flows in the channel formation region.

For example, when an In—Ga—Zn-based oxide film formed by sputtering is used as each of the first and third metal oxide films, the first and third metal oxide films can be deposited with use of an In—Ga—Zn-based oxide target containing In, Ga, and Zn at an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Furthermore, when the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the edge portion of the semiconductor film included in the transistor may be inclined or may be rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device using the transistor. Furthermore, when the semiconductor film including the stacked metal oxide films is used in the transistor, the n-type region preferably reaches the second metal oxide film part of which is to be a channel region in order that the mobility and on-state current of the transistor can be further increased and the semiconductor device can operate at higher speed.

Note that the contents of this embodiment or part thereof can be combined freely with the contents of other embodiments or part thereof.

(Embodiment 7)

In this embodiment, a circuit diagram of the memory element portion of the present invention is described with reference to FIGS. 4A to 4C.

Figure 4A:
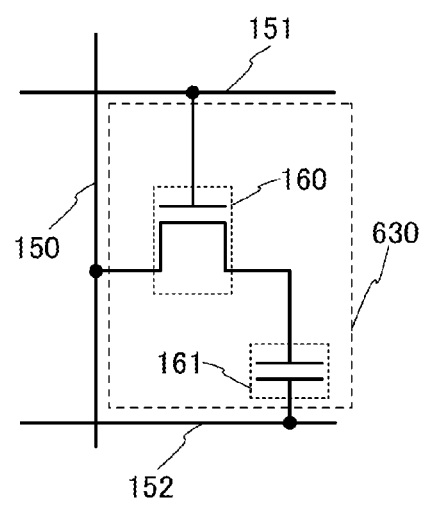
FIGS. 4A to 4C are circuit diagrams of memory cells and a memory cell array of embodiments of the present invention.

FIG. 4A illustrates an example of a circuit provided in the memory element portion of the semiconductor device. In a memory cell 630 illustrated in FIG. 4A, one of a source and a drain of a transistor 160 is electrically connected to a wiring 150 (also referred to as bit line). A gate of the transistor 160 is electrically connected to a wiring 151 (also referred to as word line). The other of the source and the drain of the transistor 160 is electrically connected to one electrode of the capacitor 161. The other electrode of the capacitor 161 is electrically connected to a wiring 152 (also referred to as capacitor line).

Here, a transistor in which a channel formation region includes an oxide semiconductor is employed as the transistor 160. The transistor including an oxide semiconductor has a characteristic of extremely low off-state current. Therefore, the potential supplied to the capacitor 161 can be held for an extremely long time by turning off the transistor 160.

The circuit shown in FIG. 4A utilizes a characteristic in which the potential supplied to the capacitor 161 can be held, whereby writing, holding, and reading of data can be performed as follows.

First of all, writing and holding of analog data will be described. For simplicity, the potential of the wiring 152 is fixed here. First, the potential of the wiring 151 is set to a potential which allows the transistor 160 to be turned on, so that the transistor 160 is turned on. In this manner, the potential of the wiring 150 is supplied to the one electrode of the capacitor 161. That is, predetermined charge is given to the capacitor 161 (writing is performed). After that, the potential of the wiring 151 is set to a potential which allows the transistor 160 to be turned off, so that the transistor 160 is turned off. Thus, the charge given to the capacitor 161 is held (holding is performed). Since the off-state current of the transistor 160 is extremely small as described above, the charge can be held for a long time. Accordingly, the analog data can be prevented from deteriorating. Note that the transistor 160 including an oxide semiconductor enables low-power writing and has very high operation speed.

Next, reading of data will be described. By setting the potential of the wiring 151 to a potential which allows the transistor 160 to be turned on while a predetermined potential (constant potential) is supplied to the wiring 150, the potential of the wiring 150 varies depending on the amount of charge held in the capacitor 161. Therefore, the held data can be read by measuring the potential of the wiring 150 (reading is performed).

Note that although the memory cell to hold data in FIG. 4A includes one transistor 160 which functions as a switching element, the present invention is not limited to this structure. In one embodiment of the present invention, at least one transistor which functions as a switching element is provided in the memory cell, and the number of such transistors may be two or more. In the case where the memory cell includes a plurality of transistors serving as switching elements, the transistors may be connected to each other in parallel, in series, or in series-parallel combination.

Note that in this specification, the state where the transistors are connected to each other in series means, for example, a state where one of a source electrode and a drain electrode of a first transistor is connected to one of a source electrode and a drain electrode of a second transistor. In addition, the state where the transistors are connected to each other in parallel means, for example, the state where one of a source electrode and a drain electrode of a first transistor is connected to one of a source electrode and a drain electrode of a second transistor and the other of the source electrode and the drain electrode of the first transistor is connected to the other of the source electrode and the drain electrode of the second transistor.

The transistor 160 includes a gate electrode at least on one side of an active layer. Alternatively, the transistor may include a pair of gate electrodes with the active layer positioned therebetween. In that case, one of the gate electrodes may be supplied with a signal for controlling switching, and the other of the gate electrodes (a back gate electrode) may be in a floating state (i.e., electrically isolated) or may be supplied with a potential from another wiring. In the latter case, potentials with the same level may be supplied to the pair of gate electrodes, or a fixed potential such as a ground potential may be supplied to only the back gate electrode. The level of the potential applied to the back gate electrode is controlled, so that the threshold voltage of the transistor 160 can be controlled.

Figure 4B:
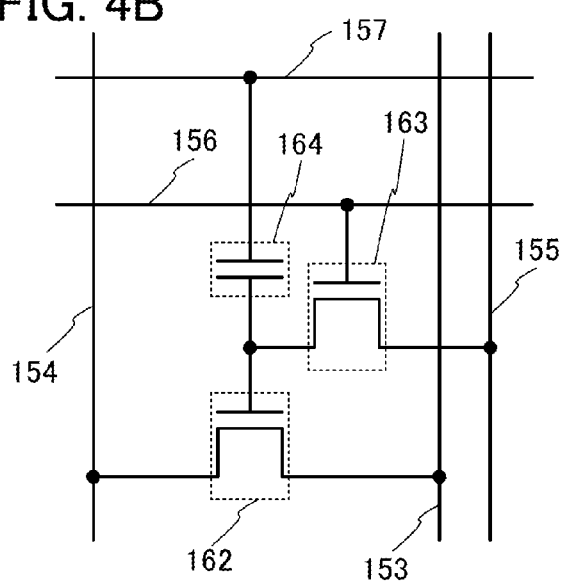

The memory element portion of the semiconductor device may include the circuit illustrated in FIG. 4B. In the circuit illustrated in FIG. 4B, a wiring 153 (also referred to as read bit line) is electrically connected to one of a source and a drain of a transistor 162. A wiring 154 (also referred to as source line) is electrically connected to the other of the source and the drain of the transistor 162. The wiring 155 (also referred to as write bit line) is electrically connected to one of a source and a drain of a transistor 163. A wiring 156 (also referred to as word line) is electrically connected to a gate of the transistor 163. A gate of the transistor 162 is electrically connected to the other of the source and the drain of the transistor 163 and one electrode of a capacitor 164. A wiring 157 (also referred to as capacitor line) is electrically connected to the other electrode of the capacitor 164.

Note that the structure of the circuit illustrated in FIG. 4B is not limited to the above description. For example, the wiring 153 that is a read bit line and the wiring 154 that is a source line may be interchanged. Furthermore, one wiring may serve as the wiring 153 that is a read bit line and the wiring 155 that is a write bit line.

Here, a channel formation region of the transistor 163 includes an oxide semiconductor. The transistor including an oxide semiconductor has a characteristic of extremely low off-state current. For that reason, the potential of a gate electrode of the transistor 162 can be held for an extremely long time by turning off the transistor 163. The capacitor 164 facilitates holding of charge given to the gate electrode of the transistor 162 and reading of held data. Note that the transistor 163 including an oxide semiconductor enables low-power writing and has very high operation speed. The transistor 162 may also be the transistor including an oxide semiconductor.

Figure 4C:
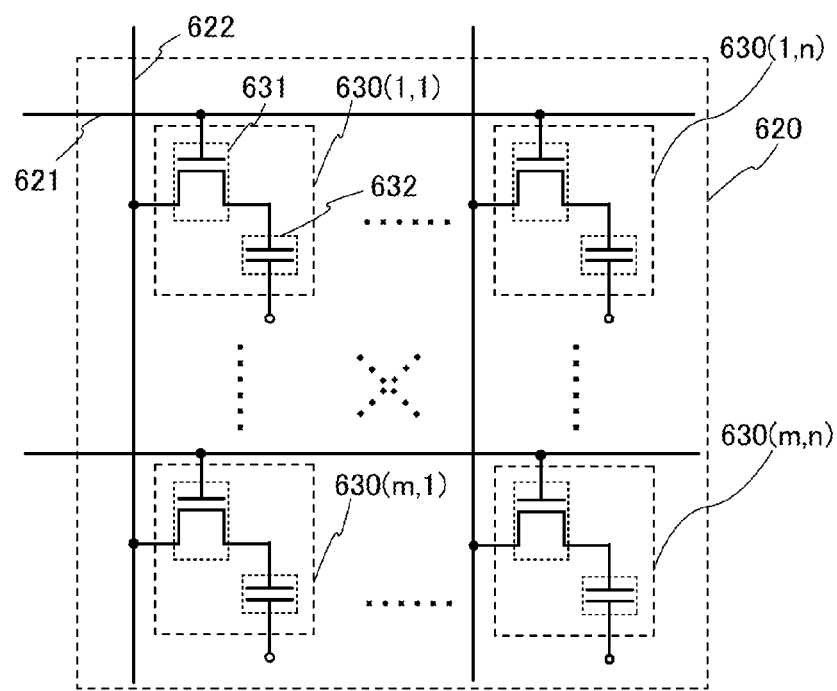

FIG. 4C illustrates an example of a combination of the circuits illustrated in FIG. 4A. In a memory cell array 620 illustrated in FIG. 4C, the memory cells 630 are arranged in a matrix of m rows and n columns (m and n are each an integer of 2 or more). For example, the first column of the memory cell array 620 includes the m memory cells 630, i.e., memory cells 630 (1, 1) to 630 (m, 1), and the first row of the memory cell array 620 includes the n memory cells 630, i.e., memory cells 630 (1, 1) to 630 (1, n). Furthermore, the memory cell array 620 includes m wirings 621 (also referred to as word lines) and n wirings 622 (also referred to as bit lines). Note that each of the memory cells 630 (1, 1) to 630 (m, n) corresponds to the memory cell 630 illustrated in FIG. 4A.

The memory cell 630 (i, j) includes a transistor 631 and a capacitor 632 (i is an integer greater than or equal to 2 and less than or equal to m, and j is an integer greater than or equal to 2 and less than or equal to n). A gate of the transistor 631 is connected to the wiring 621. One of a source and a drain of the transistor 631 is connected to the wiring 622. The other of the source and the drain of the transistor 631 is connected to one electrode of the capacitor. The other electrode of the capacitor is connected to a capacitor line and is supplied with a predetermined potential. Note that the capacitor line is not shown in FIG. 4C.

The transistor 631 is the transistor including an oxide semiconductor. The transistor including an oxide semiconductor has a characteristic of extremely low off-state current. In the case where data is stored by control of the amount of charge as in the memory cell 630 (i, j) illustrated in FIG. 4C, supply of charge to the memory cell 630 (i, j), discharge of charge from the memory cell 630 (i, j), and holding of charge in the memory cell 630 (i, j) are controlled with the use of the transistor 631 functioning as a switching element. Thus, the length of a data holding time depends on the amount of leakage of charge accumulated in the memory cell 630 (i, j), through the transistor 631.

In one embodiment of the present invention, the off-state current of the transistor 631 can be extremely low as described above. Accordingly, the charge can be prevented from leaking, which enables a longer data holding time. In addition, an analog signal can be prevented from deteriorating. The frequency of refresh operation can be low and thus, power consumption of the memory element portion can be reduced. High-speed operation of the memory element portion and the semiconductor device can also be achieved.

Note that the semiconductor device may include a driver circuit to drive the memory cell array 620 illustrated in FIG. 4C. For an active layer of a transistor included in the driver circuit, an oxide semiconductor may be used or the following semiconductor other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. Note that when the active layers of all the transistors in the memory device that includes the above memory element portion are formed using an oxide semiconductor, a manufacturing process of the semiconductor device can be simplified. Furthermore, when the active layer of the transistor included in the driver circuit is formed using, for example, a semiconductor material such as polycrystalline silicon or single crystal silicon that has higher mobility than an oxide semiconductor, the semiconductor device can operate at high speed.

The memory cell 630 in FIG. 4A and the memory cell 630 (i, j) in FIG. 4C may each include a transistor, a diode, a resistor, a capacitor, an inductor, or other circuit elements as needed.

Although FIG. 4C illustrates an example of the case where the transistor 631 has a single-gate structure, the transistor 631 may have a multi-gate structure in which a plurality of electrically connected gate electrodes are included so that a plurality of channel formation regions are included.

With the above structure, a semiconductor device with low power consumption and high performance can be provided at low cost.

Note that the contents of this embodiment or part thereof can be combined freely with the contents of other embodiments or part thereof.

(Embodiment 8)

In this embodiment, an example of a cross-sectional structure of the semiconductor device of the present invention is described with reference to FIGS. 5A and 5B.

Figure 5A:
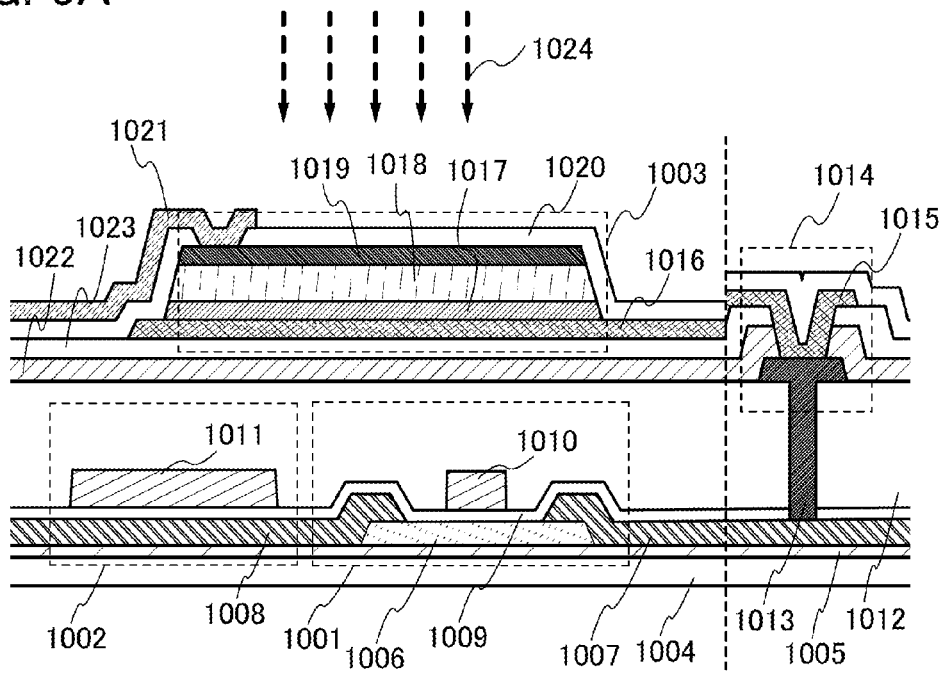
FIGS. 5A and 5B are cross-sectional views each illustrating a semiconductor device of one embodiment of the present invention.

FIG. 5A illustrates an example of a cross-sectional structure of the semiconductor device that has the memory element portion and the sensor portion. The memory element portion includes a transistor 1001 and a capacitor 1002. The transistor 1001 has a kind of a top-gate structure. The sensor portion includes an optical sensor 1003 stacked over the memory element portion.

The transistor 1001 includes, over an insulating film 1005 provided over a substrate 1004, an oxide semiconductor layer 1006, a conductive layer 1007 serving as one of a source electrode and a drain electrode, a conductive layer 1008 serving as the other of the source electrode and the drain electrode, a gate insulating film 1009, and a gate electrode 1010.

In FIG. 5A, an electrode 1011 is provided over the gate insulating film 1009 to overlap with the conductive layer 1008. A region in which the conductive layer 1008 overlaps with the electrode 1011 with the gate insulating film 1009 positioned therebetween serves as the capacitor 1002.

An insulating layer 1012 is provided to cover the gate electrode 1010, the electrode 1011, and the gate insulating film 1009. An opening is provided in the gate insulating film 1009 and the insulating layer 1012, and a conductive layer 1013 is provided in the opening. Over the insulating layer 1012, an insulating layer 1022 and an insulating layer 1023 are provided. In an opening provided in the insulating layer 1022 and the insulating layer 1023, a conductive layer 1015 is provided to be in contact with the conductive layer 1013. The conductive layer 1015 is electrically connected to an electrode 1016 that is provided in the sensor portion. Note that the conductive layer 1015 and the electrode 1016 have the same hatch pattern in FIG. 5A and FIG. 5B, which is referred to later, because they can be formed in the same process. With the above structure, the memory element portion and the sensor portion thereover are functionally connected through a contact portion 1014.

In this embodiment, a cross-sectional structure of a photodiode that corresponds to a photoelectric conversion element portion of the optical sensor 1003 is described. The optical sensor 1003 is an amorphous thin film optical sensor and includes a PIN photodiode in which a p layer, an i layer, and an n layer formed with amorphous silicon are stacked. The optical sensor 1003 senses light 1024 incident from above the substrate.

Over the electrode 1016, a semiconductor layer that has p-type conductivity is provided as a first semiconductor layer 1017. Over the first semiconductor layer 1017, a high-resistance semiconductor layer (i-type semiconductor layer) is provided as a second semiconductor layer 1018. Over the second semiconductor layer 1018, a semiconductor layer that has n-type conductivity is provided as a third semiconductor layer 1019. An insulating layer 1020 is provided over the third semiconductor layer 1019. An electrode 1021 is connected to the third semiconductor layer 1019 through an opening provided in the insulating layer 1020.

The first semiconductor layer 1017 is a p-type semiconductor layer and can be formed using an amorphous silicon film containing an impurity element imparting p-type conductivity. The first semiconductor layer 1017 is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Alternatively, an amorphous silicon film which does not contain an impurity element may be formed, and then, an impurity element may be introduced into the amorphous silicon film by a diffusion method or an ion implantation method. After the impurity element is introduced by an ion implantation method or the like, heating or the like may be conducted in order to diffuse the impurity element. In this case, as a method for forming the amorphous silicon film, a low-pressure chemical vapor deposition (LPCVD) method, a vapor deposition method, a sputtering method, or the like may be used. The first semiconductor layer 1017 is preferably formed to have a thickness of 10 nm to 50 nm.

The second semiconductor layer 1018 is an i-type semiconductor layer (an intrinsic semiconductor layer) and is formed using an amorphous silicon film. The second semiconductor layer 1018 is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 1018 may be formed by an LPCVD method, a vapor deposition method, a sputtering method, or the like. The second semiconductor layer 1018 is preferably formed to have a thickness of 200 nm to 1000 nm.

The third semiconductor layer 1019 is an n-type semiconductor layer and is formed using an amorphous silicon film containing an impurity element imparting n-type conductivity. The third semiconductor layer 1019 is formed by a plasma CVD method with the use of a semiconductor source gas containing an impurity element belonging to Group 15 (such as phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Alternatively, an amorphous silicon film which does not contain an impurity element may be formed, and then, an impurity element may be introduced into the amorphous silicon film by a diffusion method or an ion implantation method. After the impurity element is introduced by an ion implantation method or the like, heating or the like may be conducted in order to diffuse the impurity element. In this case, as a method for forming the amorphous silicon film, an LPCVD method, a vapor deposition method, a sputtering method, or the like may be used. The third semiconductor layer 1019 is preferably formed to have a thickness of 20 nm to 200 nm.

With the use of a polycrystalline semiconductor or a microcrystalline semiconductor instead of an amorphous semiconductor for the first semiconductor layer 1017, the second semiconductor layer 1018, and the third semiconductor layer 1019, a polycrystalline thin film optical sensor can be formed. Alternatively, only the second semiconductor layer 1018 may be formed with a polycrystalline semiconductor or a microcrystalline semiconductor.

The microcrystalline semiconductor belongs to a metastable state which is an intermediate state between an amorphous state and a single crystal state, considering Gibbs free energy. That is, the microcrystalline semiconductor is a semiconductor having a third state which is stable in terms of free energy and has a short range order and lattice distortion. In the microcrystalline semiconductor, columnar or needle-like crystals grow in a normal direction with respect to a surface of a substrate. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The microcrystalline semiconductor includes at least 1 at % of hydrogen or halogen to terminate a dangling bond. Moreover, a rare gas element such as helium, argon, krypton, or neon may be included to further promote lattice distortion, so that a favorable microcrystalline semiconductor film with enhanced stability can be obtained.

This microcrystalline semiconductor film can be formed by a high-frequency plasma CVD method with a frequency of higher than or equal to several tens of megahertz and lower than or equal to several hundreds of megahertz or a microwave plasma CVD method with a frequency of 1 GHz or higher. Typically, the microcrystalline semiconductor film can be formed by using a gas obtained by diluting silicon hydride, such as $SiH_4$, $Si_2H_6$, $SiH_2Cl_2$, $SiHCl_3$, $SiCl_4$, or $SiF_4$, with hydrogen. The microcrystalline semiconductor film can also be formed with dilution with one or more kinds of rare gas elements selected from helium, argon, krypton, and neon in addition to silicon hydride and hydrogen. In this case, the flow rate of hydrogen is set 5 times to 200 times, preferably 50 times to 150 times, more preferably 100 times, as high as that of silicon hydride. Furthermore, a gas including silicon may be mixed with a carbide gas such as $CH_4$ or $C_2H_6$, a germanium gas such as $GeH_4$ or $GeF_4$, $F_2$, or the like.

In addition, the mobility of holes generated by the photoelectric effect is lower than the mobility of electrons. Therefore, in the case of a PIN photodiode formed by stacking semiconductor layers, the p-type semiconductor layer side may be used as a light-receiving plane.

In this manner, the optical sensor having sensitivity to visible light is used, whereby ambient illuminance can be acquired as an analog value. The acquired analog data can be stored in the memory element portion.

Note that in the above structure example, the sensor portion is provided over the memory element portion; thus, the area occupied by the semiconductor device can be small. As a result, the semiconductor device can be downsized. Note that the structures of the sensor portion and the memory element portion are not limited to the above description. For example, the sensor portion and the memory element portion may be provided on the same level in the semiconductor device.

Although the transistor 1001 has a single-gate structure in the above description, the transistor 1001 may have a multi-gate structure with a plurality of channel formation regions, as needed. Alternatively, the transistor 1001 may have a bottom-gate structure.

As the substrate 1004, an alkali-free glass substrate of barium borosilicate glass, aluminoborosilicate glass, aluminosilicate glass, or the like is preferably used. In addition, a quartz substrate, a sapphire substrate, or the like can be used. A flexible substrate may also be used as the substrate 1004. In the case where a flexible substrate is used, the transistor 1001 may be directly provided on the flexible substrate; alternatively, the transistor 1001 may be provided over another formation substrate, undergo a transfer process, and then be transferred over the flexible substrate. Note that to perform the transfer process, a separation layer is preferably provided between the formation substrate and the transistor and the like. The use of a flexible substrate makes the semiconductor device highly durable.

The substrate 1004 is not limited to a simple supporting substrate, and may be a substrate where another device such as a transistor is formed. In that case, at least one of the gate electrode layer 1010, the conductive layer 1007, and the conductive layer 1008 of the transistor 1001 may be electrically connected to the above device.

The insulating film 1005 can have a function of supplying oxygen to the oxide semiconductor layer 1006 as well as a function of preventing diffusion of impurities from the substrate 1004. For this reason, the insulating film 1005 is preferably an insulating film containing oxygen, more preferably an insulating film having an oxygen content higher than that in the stoichiometric composition. Note that in the case where the substrate 1004 is a substrate where another device is formed as described above, the insulating film 1005 also functions as an interlayer insulating film. In that case, the insulating film 1005 is preferably subjected to planarization treatment such as chemical mechanical polishing (CMP) treatment so as to have a flat surface.

Note that when the insulating film 1005 is in direct contact with the oxide semiconductor layer 1006, the average surface roughness (Ra) of the insulating film 1005 is preferably greater than or equal to 0.1 nm and less than 0.5 nm. This is because a crystal included in the oxide semiconductor layer 1006 grows in the direction substantially perpendicular to the surface of the insulating film 1005.

Although light incident from above the substrate is sensed in this structure example, this embodiment is not limited thereto. For example, in order that external light incident from below the substrate can be sensed, the sensor portion may be provided between the memory element portion and the substrate.

<Modification Example>

Note that the semiconductor device described above is an example of a semiconductor device of this embodiment, and a semiconductor device partly different from the above-described semiconductor device is also included in this embodiment.

For example, a transistor in which a plurality of oxide semiconductor layers are stacked may be used in the semiconductor device. A transistor 2001 illustrated in FIG. 5B is provided over an insulating film 2005 over a substrate 2004. The transistor 2001 includes an insulating layer 2006a formed over the insulating film 2005; an oxide semiconductor layer 2006b formed over the insulating layer 2006a; a conductive layer 2007 that is in contact with part of each of the insulating layer 2006a and the oxide semiconductor layer 2006b and functions as one of a source electrode and a drain electrode; and a conductive layer 2008 that is in contact with part of each of the insulating layer 2006a and the oxide semiconductor layer 2006b and functions as the other of the source electrode and the drain electrode. The transistor 2001 includes an insulating layer 2006c that is formed over the oxide semiconductor layer 2006b and that is partly in contact with the conductive layer 2007 and the conductive layer 2008. Furthermore, the transistor 2001 includes a gate insulating film 2009 formed over the insulating layer 2006c and a gate electrode 2010 formed over the gate insulating film 2009.

Here, a semiconductor and an insulator that can be used for the insulating layer 2006a, the oxide semiconductor layer 2006b, the insulating layer 2006c, and the like are described.

Note that the insulating layer 2006a or the insulating layer 2006c is categorized as a semiconductor in some cases depending on which of the materials described later is used and the ratio of the material. In the modification example in this embodiment, the oxide semiconductor layer 2006b serves as a channel formation region of the transistor and thus, carriers do not move in the insulating layer 2006a and the insulating layer 2006c in some cases. Thus, even when the insulating layer 2006a or the insulating layer 2006c has semiconductor properties, it is referred to as an insulator in this embodiment.

The oxide semiconductor layer 2006b is an oxide semiconductor containing indium, for example. The oxide semiconductor layer 2006b can have high carrier mobility (electron mobility) by containing indium, for example. In addition, the oxide semiconductor layer 2006b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. In addition, the oxide semiconductor layer 2006b preferably contains zinc. When the oxide semiconductor contains zinc, the oxide semiconductor is easily crystallized, for example.

Note that the oxide semiconductor layer 2006b is not limited to the oxide semiconductor containing indium. The oxide semiconductor layer 2006b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the oxide semiconductor layer 2006b, an oxide with a wide energy gap is used, for example. The energy gap of the semiconductor layer 2006b is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the insulating layer 2006a and the insulating layer 2006c are oxides including one or more elements other than oxygen included in the oxide semiconductor layer 2006b. Since the insulating layer 2006a and the insulating layer 2006c each include one or more elements other than oxygen included in the semiconductor layer 2006b, an interface state is less likely to be formed at the interface between the insulating layer 2006a and the oxide semiconductor layer 2006b and the interface between the oxide semiconductor layer 2006b and the insulating layer 2006c.

The insulating layer 2006a, the oxide semiconductor layer 2006b, and the insulating layer 2006c preferably include at least indium. In the case of using an In-M-Zn oxide as the insulating layer 2006a, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the oxide semiconductor layer 2006b, when a summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the insulating layer 2006c, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the insulating layer 2006c may be an oxide that is a type the same as that of the insulating layer 2006a. Note that the insulating layer 2006a and/or the insulating layer 2006c do/does not need to contain indium in some cases. For example, the insulating layer 2006a and/or the insulating layer 2006c may be gallium oxide.

As the oxide semiconductor layer 2006b, an oxide having an electron affinity higher than those of the insulating layers 2006a and 2006c is used. For example, as the oxide semiconductor layer 2006b, an oxide having an electron affinity higher than those of the insulating layers 2006a and 2006c by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy difference between the vacuum level and the bottom of the conduction band.

An indium gallium oxide has small electron affinity and a high oxygen-blocking property. Therefore, the insulating layer 2006c preferably includes an indium gallium oxide. The gallium atomic ratio [Ga/(In+Ga)] is, for example, higher than or equal to 70%, preferably higher than or equal to 80%, more preferably higher than or equal to 90%.

The insulating layer 2006a, the oxide semiconductor layer 2006b, and the insulating layer 2006c form a stacked-layer structure, and a channel formation region can be formed in the oxide semiconductor layer 2006b having high electron affinity by application of gate voltage. Accordingly, the transistor can have high field-effect mobility and stable electrical characteristics.

Figure 5B:
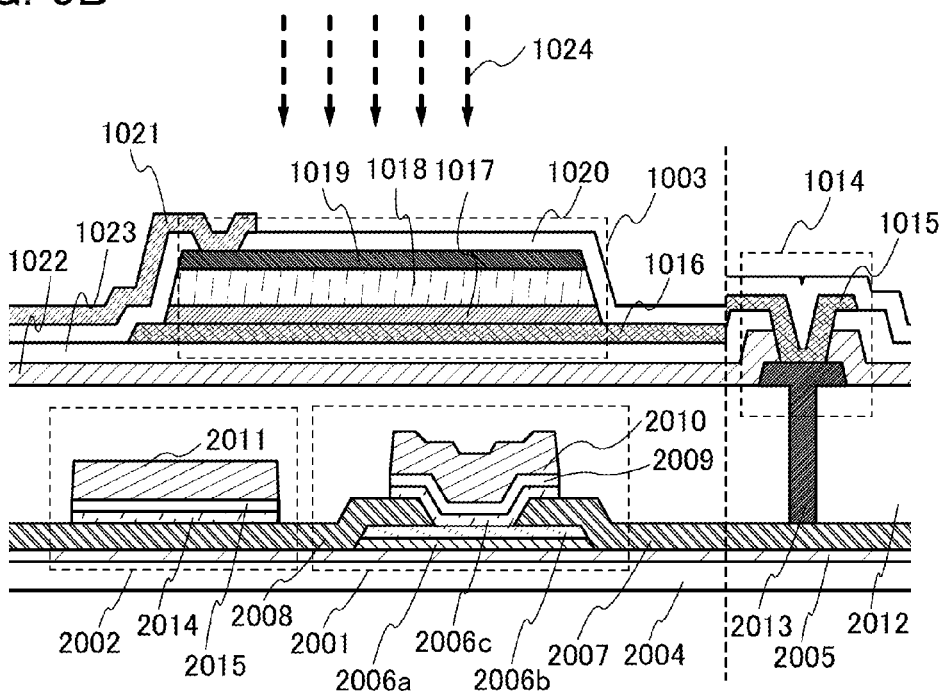

In FIG. 5B, an insulating layer 2014, an insulating layer 2015, and an electrode 2011 are provided in a region over the conductive layer 2008. The region functions as a capacitor 2002. Note that the insulating layer 2014 contains the same substance as the insulating layer 2006c and the insulating layer 2015 contains the same substance as the gate insulating film 2009.

An insulating layer 2012 is provided to cover the gate electrode 2010, the electrode 2011, the conductive layer 2007, and the conductive layer 2008. An opening is provided in the insulating layer 2012, and a conductive layer 2013 is provided in the opening. The conductive layer 1015 is in contact with the conductive layer 2013. With the above structure, the memory element portion and the sensor portion thereover are functionally connected through the contact portion 1014.

Note that the contents of this embodiment or part thereof can be combined freely with the contents of other embodiments or part thereof.

(Embodiment 9)

In this embodiment, an example of a cross-sectional structure of the semiconductor device of the present invention is described with reference to FIGS. 6A and 6B.

Figure 6A:
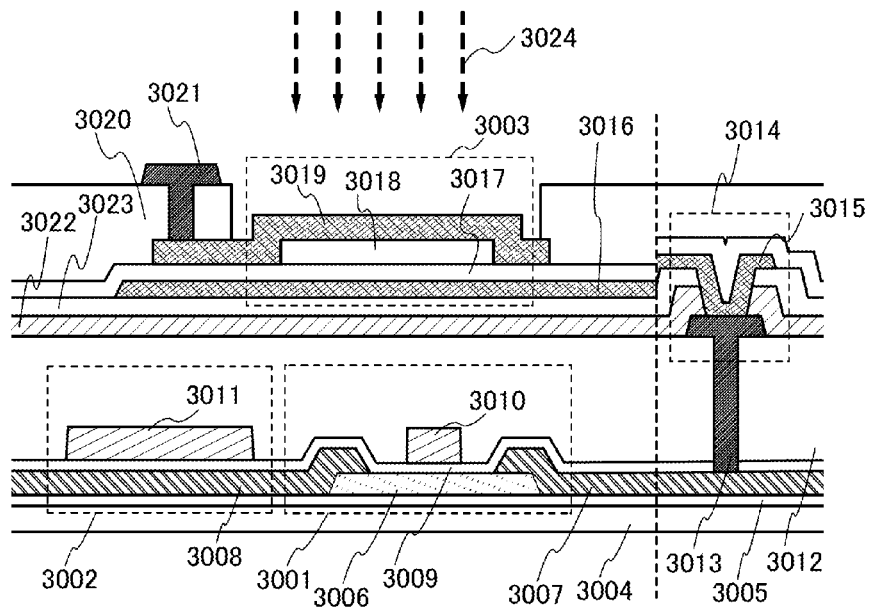
FIGS. 6A and 6B are cross-sectional views each illustrating a semiconductor device of one embodiment of the present invention.

FIG. 6A illustrates an example of a cross-sectional structure of the semiconductor device that has the memory element portion and the sensor portion. The memory element portion includes a transistor 3001 and a capacitor 3002. The transistor 3001 has a kind of a top-gate structure. The sensor portion includes a pressure sensor 3003 stacked over the memory element portion.

The transistor 3001 includes, over an insulating film 3005 provided over a substrate 3004, an oxide semiconductor layer 3006, a conductive layer 3007 serving as one of a source electrode and a drain electrode, a conductive layer 3008 serving as the other of the source electrode and the drain electrode, a gate insulating film 3009, and a gate electrode 3010.

In FIG. 6A, an electrode 3011 is provided over the gate insulating film 3009 to overlap with the conductive layer 3008. A region in which the conductive layer 3008 overlaps with the electrode 3011 with the gate insulating film 3009 positioned therebetween functions as the capacitor 3002.

An insulating layer 3012 is provided to cover the gate electrode 3010, the electrode 3011, and the gate insulating film 3009. An opening is provided in the gate insulating film 3009 and the insulating layer 3012, and a conductive layer 3013 is provided in the opening. Over the insulating layer 3012, an insulating layer 3022 and an insulating layer 3023 are provided. In an opening provided in the insulating layer 3022 and the insulating layer 3023, a conductive layer 3015 is provided to be in contact with the conductive layer 3013. The conductive layer 3015 is electrically connected to a first conductive layer 3016 that is provided in the sensor portion. Note that the conductive layer 3015 and the first conductive layer 3016 have the same hatch pattern in FIG. 6A and FIG. 6B, which is referred to later, because they can be formed in the same process. With the above structure, the memory element portion and the sensor portion thereover are functionally connected through a contact portion 3014.

The pressure sensor 3003 in this embodiment is a kind of a microelectromechanical system (MEMS). In addition, an MEMS is also simply called a micro machine.

The pressure sensor 3003 includes, over the insulating layer 3023, the first conductive layer 3016, an insulating layer 3017, and a second conductive layer 3019 that is a structural layer. An end portion of the second conductive layer 3019 is covered with an insulating layer 3020. In an opening provided in the insulating layer 3020, an electrode layer 3021 is formed to be connected to the second conductive layer 3019.

In the pressure sensor 3003, part of the second conductive layer 3019 is exposed. Under the second conductive layer 3019, a space 3018 is provided. The space allows change in shape of the second conductive layer 3019 due to pressure applied from the outside. For example, the second conductive layer 3019 is changed in shape in a vertical or horizontal direction or is changed in shape such that the second conductive layer 3019 rotates about an axis by pressure 3024. Accordingly, a variable capacitor in which the distance between the first conductive layer 3016 and the second conductive layer 3019 is variable can be formed. With this structure, a pressure sensing element can be formed.

For the first conductive layer 3016 and the second conductive layer 3019, a metal material or a crystalline semiconductor material can be used. Alternatively, an oxide conductor may be formed by adding hydrogen or an impurity element to an oxide semiconductor of the same kind as that used for the oxide semiconductor layer 3006. The oxide conductor can be used for at least one of the first conductive layer 3016 and the second conductive layer 3019. The use of an oxide conductor allows the semiconductor device to have a high light-transmitting property.

The second conductive layer 3019 can be formed by stacking two kinds of substances with different coefficients of thermal expansion. In that case, the second conductive layer 3019 expands and contracts in accordance with temperature, whereby the temperature can be measured.

To form the space 3018, a sacrifice layer is formed in a region where the space is to be formed, the second conductive layer 3019 is formed over the sacrifice layer, and in a later step, the sacrifice layer is removed by etching or the like. Such a sacrifice layer can be formed using a material containing a metal element, a metal compound, an oxide semiconductor, silicon, silicon oxide, or silicon nitride. Furthermore, the sacrifice layer may be a conductor or an insulator.

In this manner, the pressure sensor having sensitivity to pressure is used, whereby pressure applied to the semiconductor device can be acquired as analog data. The acquired analog data can be stored in the memory element portion.

Note that in the above structure example, the sensor portion is provided over the memory element portion; thus, the area occupied by the semiconductor device can be small. As a result, the semiconductor device can be downsized. Note that the structures of the sensor portion and the memory element portion are not limited to the above description. For example, the sensor portion and the memory element portion may be provided on the same level in the semiconductor device.

Although the transistor 3001 has a single-gate structure in the above description, the transistor 3001 may have a multi-gate structure with a plurality of channel formation regions, as needed. Alternatively, the transistor 3001 may have a bottom-gate structure.

As the substrate 3004, an alkali-free glass substrate of barium borosilicate glass, aluminoborosilicate glass, aluminosilicate glass, or the like is preferably used. In addition, a quartz substrate, a sapphire substrate, or the like can be used. A flexible substrate may also be used as the substrate 3004. In the case where a flexible substrate is used, the transistor 3001 may be directly provided on the flexible substrate; alternatively, the transistor 3001 may be provided over another formation substrate, undergo a transfer process, and then be transferred over the flexible substrate. Note that to perform the transfer process, a separation layer is preferably provided between the formation substrate and the transistor and the like. The use of a flexible substrate makes the semiconductor device highly durable.

The substrate 3004 is not limited to a simple supporting substrate, and may be a substrate where another device such as a transistor is formed. In that case, at least one of the gate electrode 3010, the conductive layer 3007, and the conductive layer 3008 of the transistor 3001 may be electrically connected to the above device.

The insulating film 3005 can have a function of supplying oxygen to the oxide semiconductor layer 3006 as well as a function of preventing diffusion of impurities from the substrate 3004. For this reason, the insulating film 3005 is preferably an insulating film containing oxygen, more preferably an insulating film having an oxygen content higher than that in the stoichiometric composition. Note that in the case where the substrate 3004 is a substrate where another device is formed as described above, the insulating film 3005 also functions as an interlayer insulating film. In that case, the insulating film 3005 is preferably subjected to planarization treatment such as CMP treatment so as to have a flat surface.

Note that when the insulating film 3005 is in direct contact with the oxide semiconductor layer 3006, the average surface roughness (Ra) of the insulating film 3005 is preferably greater than or equal to 0.1 nm and less than 0.5 nm. This is because a crystal included in the oxide semiconductor layer 3006 grows in the direction substantially perpendicular to the surface of the insulating film 3005.

Although pressure applied from above the substrate is measured in this structure example, this embodiment is not limited thereto. For example, in order that pressure applied from below the substrate can be measured, the sensor portion may be provided between the memory element portion and the substrate.

<Modification Example>

Note that the semiconductor device described above is an example of a semiconductor device of this embodiment, and a semiconductor device partly different from the above-described semiconductor device is also included in this embodiment.

For example, a transistor in which a plurality of oxide semiconductor layers are stacked may be used in the semiconductor device. A transistor 4001 illustrated in FIG. 6B is provided over an insulating film 4005 over a substrate 4004. The transistor 4001 includes an insulating layer 4006a formed over the insulating film 4005; an oxide semiconductor layer 4006b formed over the insulating layer 4006a; a conductive layer 4007 that is in contact with part of each of the insulating layer 4006a and the oxide semiconductor layer 4006b and functions as one of a source electrode and a drain electrode; and a conductive layer 4008 that is in contact with part of each of the insulating layer 4006a and the oxide semiconductor layer 4006b and functions as the other of the source electrode and the drain electrode. The transistor 4001 includes an insulating layer 4006c that is formed over the oxide semiconductor layer 4006b and that is partly in contact with the conductive layer 4007 and the conductive layer 4008. Furthermore, the transistor 4001 includes a gate insulating film 4009 formed over the insulating layer 4006c and a gate electrode 4010 formed over the gate insulating film 4009.

For the insulating layer 4006a, the description of the insulating layer 2006a is referred to. For the oxide semiconductor layer 4006b, the description of the oxide semiconductor layer 2006b is referred to. For the insulating layer 4006c, the description of the insulating layer 2006c is referred to.

The insulating layer 4006a, the oxide semiconductor layer 4006b, and the insulating layer 4006c form a stacked-layer structure, and a channel formation region can be formed in the oxide semiconductor layer 4006b having high electron affinity by application of gate voltage. Accordingly, the transistor can have high field-effect mobility and stable electrical characteristics.

Figure 6B:
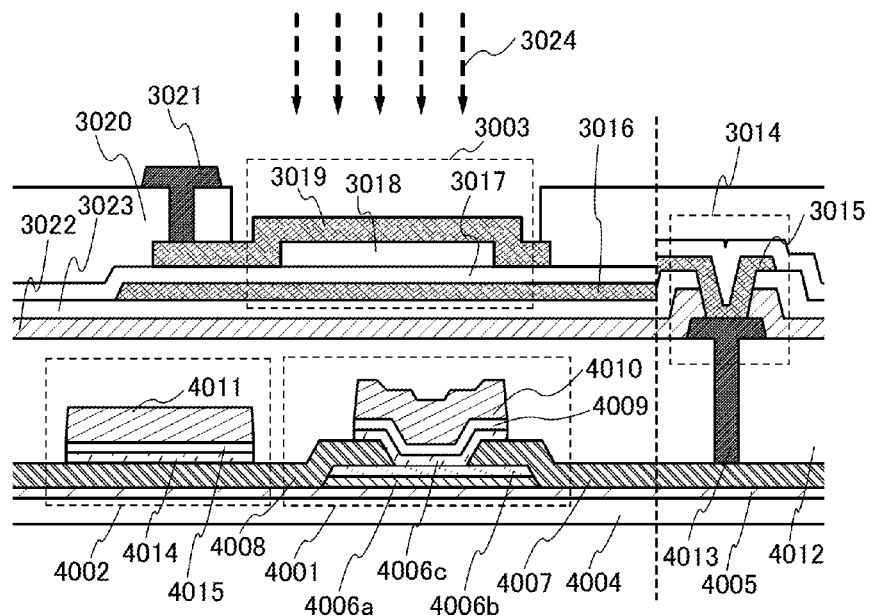

In FIG. 6B, an oxide semiconductor layer 4014, an insulating layer 4015, and an electrode 4011 are provided in a region over the conductive layer 4008. The region functions as a capacitor 4002. Note that the oxide semiconductor layer 4014 contains the same substance as the insulating layer 4006c and the insulating layer 4015 contains the same substance as the gate insulating film 4009.

An insulating layer 4012 is provided to cover the gate electrode 4010, the electrode 4011, the conductive layer 4007, and the conductive layer 4008. An opening is provided in the insulating layer 4012, and a conductive layer 4013 is provided in the opening. The conductive layer 3015 is in contact with the conductive layer 4013. With the above structure, the memory element portion and the sensor portion thereover are functionally connected through the contact portion 3014.

Note that the contents of this embodiment or part thereof can be combined freely with the contents of other embodiments or part thereof.

(Embodiment 10)

In this embodiment, examples of an optical sensor and an amplifier that can be used for the semiconductor device of the present invention are described with reference to FIGS. 7A and 7B.

Figure 7A:
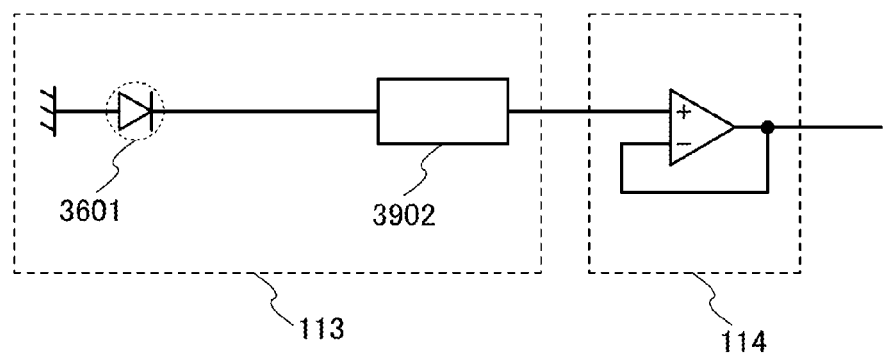
FIGS. 7A and 7B illustrate structure examples of a semiconductor device of one embodiment of the present invention.

FIG. 7A shows a basic configuration. When a photoelectric conversion element 3601 is irradiated with light, a current flows in accordance with the illuminance. The current is converted into a voltage signal in a current/voltage converter circuit 3902. In this manner, the photoelectric conversion element 3601 and the current/voltage converter circuit 3902 form an optical sensor 113. A signal outputted from the optical sensor 113 is inputted to an amplifier 114. Although FIG. 7A illustrates a voltage follower circuit using an operational amplifier, the present invention is not limited to this structure. The memory element portion may be provided between the optical sensor 113 and the amplifier 114.

Figure 7B:
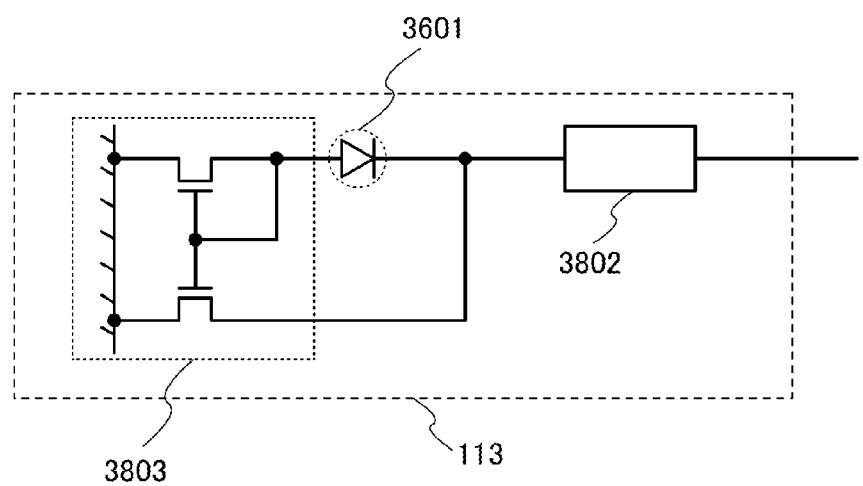

In addition, a structure may be employed in which a current flowing through the photoelectric conversion element 3601 and a current mirror circuit 3803 is supplied to a current/voltage converter circuit 3802 as shown in FIG. 7B so that the sensitivity to light can be improved as well as the noise immunity can be improved. In such a structure, a wiring connected to the photoelectric conversion element 3601 can be connected to an output of the current mirror circuit; therefore, the number of connection terminals can be reduced.

Note that the contents of this embodiment or part thereof can be combined freely with the contents of other embodiments or part thereof.

(Embodiment 11)

In this embodiment, an example of an inspection device that can acquire functional data on a living body is described with reference to FIGS. 8A to 8E.

Figure 8A:
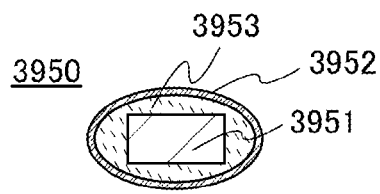
FIGS. 8A to 8E illustrate structure examples and application examples of a semiconductor device of one embodiment of the present invention.

An inspection device 3950 in FIG. 8A includes a semiconductor device 3951 that is one embodiment of the present invention in a capsule 3952 coated with a protective layer. A space between the capsule 3952 and the semiconductor device 3951 may be filled with a filler 3953.

Figure 8B:
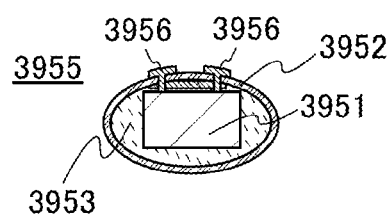

An inspection device 3955 in FIG. 8B includes the semiconductor device 3951 that is one embodiment of the present invention in the capsule 3952 coated with a protective layer. An electrode 3956 of the semiconductor device is exposed from the capsule 3952. A space between the capsule 3952 and the semiconductor device 3951 may be filled with the filler 3953.

The semiconductor device 3951 provided in each of the inspection devices 3950 and 3955 is the semiconductor device including the sensor portion. In the sensor portion, physical quantity or chemical quantity is measured to acquire functional data on a living body. Acquired analog data can be stored in the memory element portion. In the case of measuring pressure, light, sound wave, or the like as physical quantity, the inspection device 3950 in which the electrode is not exposed from the capsule 3952 as shown in FIG. 8A can be used. In the case of detecting temperature, flow rate, magnetism, acceleration, humidity, a chemical substance such as a component included in a gas or a liquid (e.g., an ion), or the like, it is preferable to use the inspection device 3955 in which the electrode 3956 is exposed from the capsule 3952 as shown in FIG. 8B.

The protective layer provided at the surface of the capsule preferably contains diamond like carbon (DLC), silicon nitride, silicon oxide, silicon oxynitride, or carbon nitride. Any of a variety of capsules and fillers can be appropriately used. By providing the capsule with the protective layer, the capsule and semiconductor device can be prevented from being dissolved or changing in quality in a living body.

Furthermore, in the case where the inspection device is to be put in a living body, it is preferable to appropriately select semiconductor materials and electrode materials that hardly have an adverse effect on the living body in forming the inspection device.

Next, usage methods of the inspection devices are described. As illustrated in FIG. 8D, a test subject 3962 swallows the inspection device 3950. The swallowed inspection device 3950 moves in a body lumen 3963. In the body lumen 3963, the inspection device 3950 acquires functional data on the living body. Data can be read out to an external circuit from the inspection device 3950 that has been excreted from the body lumen 3963, and functional data on the living body of the test subject can be analyzed.

Figure 8C:
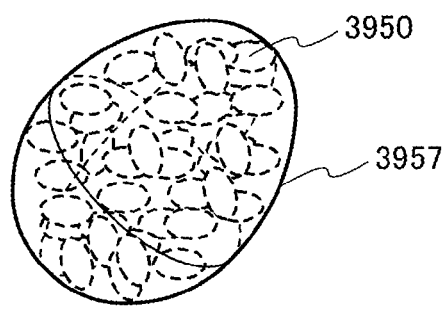
Figure 8D:
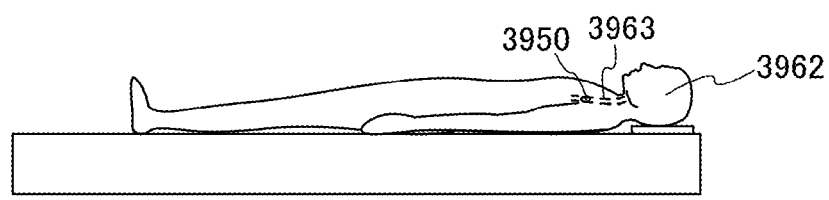
Figure 8E:
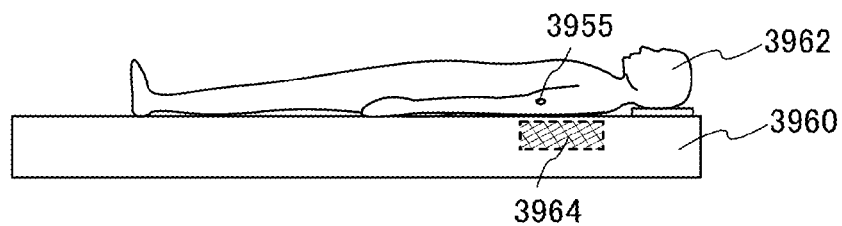

As illustrated in FIG. 8E, the inspection device 3955 may be attached to the surface of the test subject 3962 to acquire functional data on the living body of the test subject. The acquired data is transmitted to an external circuit 3964 placed near the test subject. In this case, the inspection device 3955 is attached such that the electrode 3956 touches a part to be measured of the test subject. The external circuit 3964 receives the results. The received results are recorded in a computer for biological information management and processed therein, whereby the biological information of the test subject can be managed. By providing the external circuit 3964 in a bed 3960, biological information of a test subject who has physical difficulty and can hardly move around can be acquired all the time and to monitor the state of a disease or his/her health status. The inspection device of this embodiment is inexpensive and thus, application thereof is suitable for the case where a plurality of inspection devices are replaced on a regular basis or the case where an inspection device is thrown away after one use, for example.

Note that the inspection device 3950 or the inspection device 3955 may have the configuration illustrated in FIG. 8C. In an example illustrated in FIG. 8C, a capsule 3957 is filled with the inspection devices 3950. For example, the capsule 3957 is configured to dissolve in a living body, whereby the inspection devices 3950 can be easily put in the living body.

When a plurality of semiconductor devices are used, data on the interior of a living body can be measured with a plurality of sensor portions. As a result, highly accurate and highly reliable data can be obtained. Specifically, a plurality of pieces of data that have been obtained are statistically analyzed, which inhibits an adverse effect of accidental error. In addition, standard deviation can be obtained from a plurality of pieces of data, so that data including variation in measurement can be managed. The semiconductor device provided in the inspection device of this embodiment does not include an analog/digital converter circuit. The inspection device can have a small size, thereby performing measurement with high spatial resolution in a living body. Furthermore, the inspection device can have low power consumption by using the semiconductor device described in the above embodiments.

Note that the contents of this embodiment or part thereof can be combined freely with the contents of other embodiments or part thereof.

(Embodiment 12)

In this embodiment, an example of an input/output unit that receives data acquired with the sensor portion of the semiconductor device of the present invention is described with reference to FIGS. 9A and 9B.

Figure 9A:
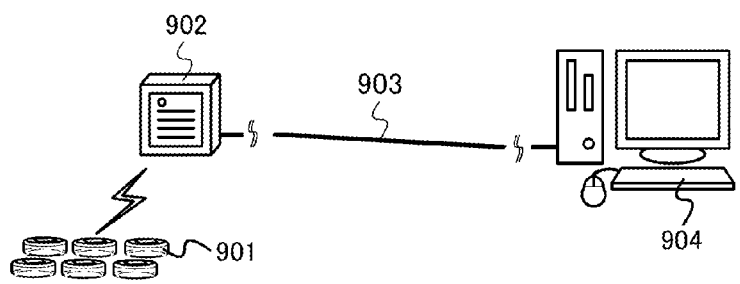
FIGS. 9A and 9B illustrate a structure example of a semiconductor device of one embodiment of the present invention.

As shown in FIG. 9A, analog data in a semiconductor device 901 of one embodiment of the present invention is read out with an input/output unit 902. The semiconductor device 901 and the input/output unit 902 transmit data wirelessly. The input/output unit 902 is connected to a computer 904 through a cable 903. The computer 904 can perform various statistical analyses on obtained data. Note that data transmission between the semiconductor device 901 and the input/output unit 902 is not necessarily wireless transmission. For example, the semiconductor device 901 and the input/output unit 902 may transmit data through a wire.

Figure 9B:
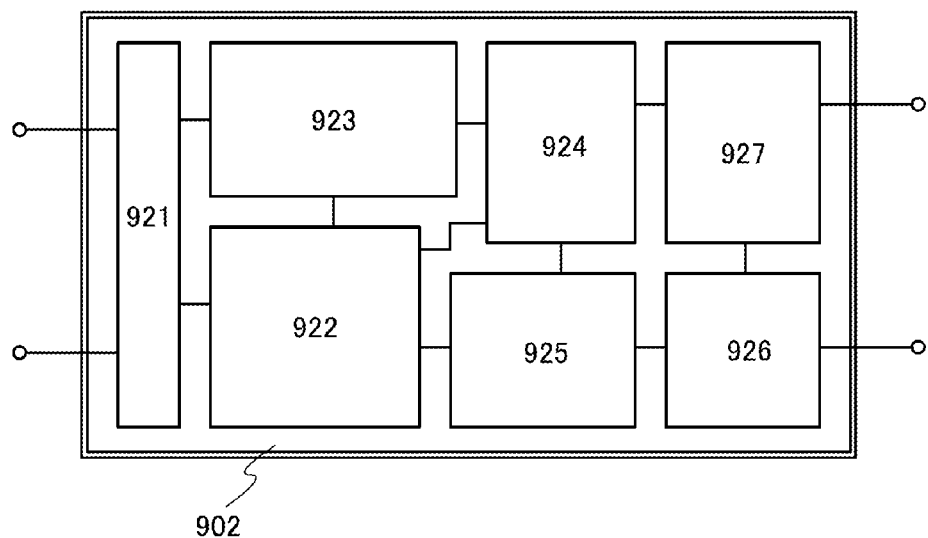

FIG. 9B shows an example of a circuit configuration of the input/output unit 902. The input/output unit includes an input port 921, an analog/digital converter circuit 922, a control circuit 923, an arithmetic processing circuit 924, a memory 925, a power supply circuit 926, and an output port 927. When an output port of the semiconductor device 901 is connected to the input port 921 of the input/output unit 902, the control circuit 923 of the input/output unit 902 acquires connection information. The analog data stored in the semiconductor device 901 can be thus transmitted to the input/output unit. The transmitted analog data is converted into a digital signal in the analog/digital converter circuit 922. The digital signal is processed with the arithmetic processing circuit 924, the memory 925, and the like to be outputted through the output port 927.

As described above, the semiconductor device 901 is not provided with an analog/digital converter circuit and the semiconductor device may have only functions of measuring and storing analog data. The analog/digital converter circuit is provided in the input/output unit 902 instead, which is outside the semiconductor device. As a result, the semiconductor device 901 can be reduced in size and manufacturing cost. At the same time, power consumption of the semiconductor device 901 can be reduced.

Note that the contents of this embodiment or part thereof can be combined freely with the contents of other embodiments or part thereof.

(Embodiment 13)

In this embodiment, an example of an electronic device provided with the semiconductor device of the present invention and an application of the semiconductor device are described with reference to FIGS. 10A and 10B.

Figure 10A:
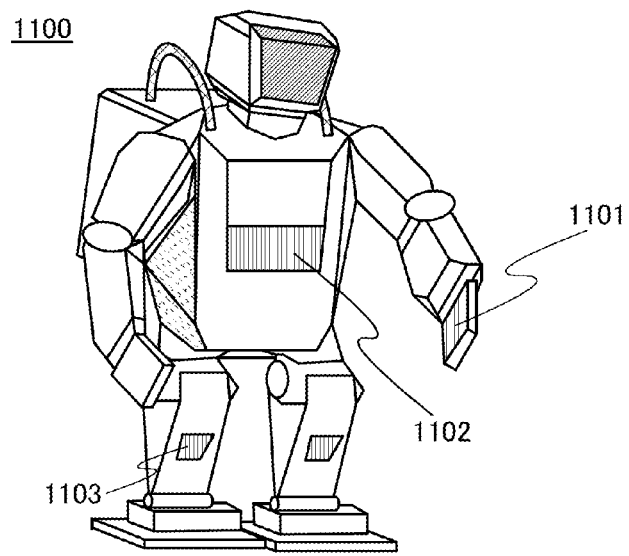
FIGS. 10A and 10B illustrate application examples of a semiconductor device of one embodiment of the present invention.

FIG. 10A illustrates a robot 1100, which has a trunk portion, leg portions, a head portion, and arm portions. The robot 1100 can be used for assisting a person in nursing care, for example. The robot can also be used as an industrial robot in a factory. The robot needs to have a tactile sensor measuring pressure and the like with high accuracy in order to hold a person or an object. For this reason, tactile sensors are distributed throughout the body of the robot 1100 with high density. The arm portion of the robot 1100 of this embodiment is provided with a plurality of semiconductor devices 1101 including tactile sensors. The trunk portion of the robot 1100 is provided with a plurality of semiconductor devices 1102 including tactile sensors. The leg portion of the robot 1100 is provided with a plurality of semiconductor devices 1103 including tactile sensors.

The tactile sensor is formed using a silicon thin film, for example, and converts change in shape of the silicon thin film when touched into change in capacitance, so that the change in shape is sensed. The range of force that can be measured by the tactile sensor and the number and density of the sensors can be appropriately set depending on the use. Other kinds of sensors may be used depending on the use. In the case where exhaustion might be caused by use, the semiconductor device may be regarded as a consumable and configured to be replaced on a regular basis.

Figure 10B:
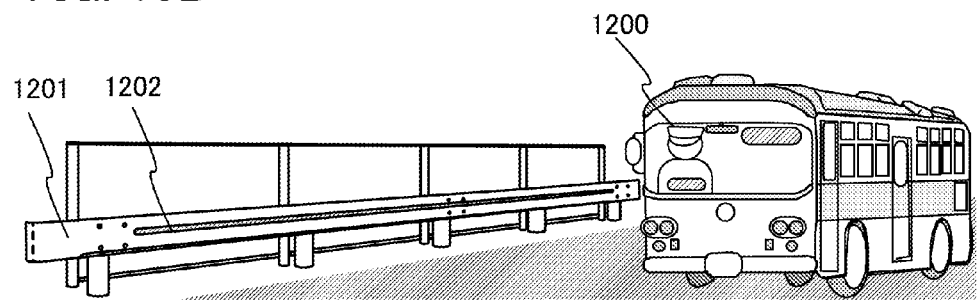

FIG. 10B illustrates outdoor use of the semiconductor device. In FIG. 10B, a bus 1200 and a guardrail 1201 along the roadside are illustrated. The guardrail 1201 is provided with a plurality of semiconductor devices 1202.

The semiconductor device 1202 includes an analog sensor that measures the amount of airborne oxynitride and the like emitted by the bus 1200 and other automobiles. The analog sensor that measures the amount of outdoor airborne pollen or contaminants such as fine particles may also be included. The use of the plurality of semiconductor devices allows such data to be acquired accurately. The semiconductor device may be configured to be replaced on a regular basis.

Although the guardrail 1201 is provided with the sensor in the example in FIG. 10B, this embodiment is not limited to this example. For example, the body of the bus 1200 or an automobile may be provided with a plurality of semiconductor devices of embodiments of the present invention so that a variety of data can be acquired. Public transportation such as a train may also be provided with a plurality of semiconductor devices of embodiments of the present invention.

When a plurality of semiconductor devices are used, data can be measured with a plurality of sensor portions. As a result, highly accurate and highly reliable data can be obtained. Specifically, a plurality of pieces of data that have been obtained are statistically analyzed, which inhibits an adverse effect of accidental error. In addition, standard deviation can be obtained from a plurality of pieces of data, so that data including variation in measurement can be managed. The semiconductor device of this embodiment does not include an analog/digital converter circuit. Accordingly, the semiconductor device can be inexpensive. Furthermore, the semiconductor device can have low power consumption.

Note that the contents of this embodiment or part thereof can be combined freely with the contents of other embodiments or part thereof.

This application is based on Japanese Patent Application serial no. 2014-108707 filed with Japan Patent Office on May 27, 2014, the entire contents of which are hereby incorporated by reference.

What is claimed is:

1. A semiconductor device comprising:
a sensor part including a sensor, the sensor part configured to acquire analog data;
a memory element part including a memory cell comprising a transistor and a capacitor electrically connected to one of a source electrode and a drain electrode of the transistor, the memory element part configured to store the analog data, wherein a channel formation region of the transistor comprises an oxide semiconductor; and
a power supply part electrically connected to the sensor part and the memory element part,
wherein the sensor is provided on an insulating layer covering the transistor and the capacitor, wherein an electrode of the sensor is electrically connected to the other of the source electrode and the drain electrode of the transistor via a conductive layer, and wherein the conductive layer is electrically connected to the electrode of the sensor and the other of the source electrode and the drain electrode of the transistor via an opening in the insulating layer.

2. The semiconductor device according to claim 1, wherein the power supply part comprises a solar cell.

3. The semiconductor device according to claim 1, wherein the oxide semiconductor comprises indium, gallium, and zinc.

4. The semiconductor device according to claim 1, wherein the sensor overlaps with the transistor.

5. The semiconductor device according to claim 1, wherein the sensor comprises one of a resistor, a capacitive coupling element, an induction coupling element, a photovoltaic element, a photoelectric conversion element, a thermoelectric element, a transistor, a thermistor, a diode, a capacitive element, and a piezoelectric element.

6. The semiconductor device according to claim 1, wherein the analog data is an analog value of physical quantity or chemical quantity measured in an environment outside the semiconductor device.

7. A semiconductor device comprising:
a sensor part including a sensor, the sensor part configured to acquire analog data of physical quantities or chemical quantities;
a memory element part including a memory cell comprising a transistor and a capacitor electrically connected to one of a source electrode and a drain electrode of the transistor, the memory element part configured to store the analog data, wherein a channel formation region of the transistor comprises an oxide semiconductor;
a power supply part electrically connected to the sensor part and the memory element part; and
an amplifier electrically connected to the memory element part,
wherein the sensor is provided on an insulating layer covering the transistor and the capacitor,
wherein an electrode of the sensor is electrically connected to the other of the source electrode and the drain electrode of the transistor via a conductive layer, and
wherein the conductive layer is electrically connected to the electrode of the sensor and the other of the source electrode and the drain electrode of the transistor via an opening in the insulating layer.

8. The semiconductor device according to claim 7, wherein the power supply part comprises a solar cell.

9. The semiconductor device according to claim 7, wherein the oxide semiconductor comprises indium, gallium, and zinc.

10. The semiconductor device according to claim 7, wherein the sensor overlaps with the transistor.

11. The semiconductor device according to claim 7, wherein the analog data is an analog value of physical quantity or chemical quantity measured in an environment outside the semiconductor device.

12. A semiconductor device comprising:
a sensor part including a sensor, the sensor part configured to acquire analog data of physical quantities or chemical quantities;
a memory element part including a memory cell comprising a transistor and a capacitor electrically connected to one of a source electrode and a drain electrode of the transistor, the memory element part configured to store the analog data, wherein a channel formation region of the transistor comprises an oxide semiconductor;
a power supply part electrically connected to the sensor part and the memory element part; and
an antenna part electrically connected the power supply part,
wherein the sensor is provided on an insulating layer covering the transistor and the capacitor,
wherein an electrode of the sensor is electrically connected to the other of the source electrode and the drain electrode of the transistor via a conductive layer, and
wherein the conductive layer is electrically connected to the electrode of the sensor and the other of the source electrode and the drain electrode of the transistor via an opening in the insulating layer.

13. The semiconductor device according to claim 12, wherein the oxide semiconductor comprises indium, gallium, and zinc.

14. The semiconductor device according to claim 12, wherein the sensor overlaps with the transistor.

15. The semiconductor device according to claim 12, wherein the sensor comprises one of a resistor, a capacitive coupling element, an induction coupling element, a photovoltaic element, a photoelectric conversion element, a thermoelectric element, a transistor, a thermistor, a diode, a capacitive element, and a piezoelectric element.

16. The semiconductor device according to claim 1, wherein the memory element part is configured to output the analog data to an external circuit.

17. A unit comprising:
the semiconductor device according to claim 1; and
an input/output device configured to read out the analog data from the semiconductor device,
wherein the input/output device includes an analog/digital converter circuit.

18. The semiconductor device according to claim 7, wherein the memory element part is configured to output the analog data to an external circuit.

19. A unit comprising:
the semiconductor device according to claim 7; and
an input/output device configured to read out the analog data from the semiconductor device,
wherein the input/output device includes an analog/digital converter circuit.

20. The semiconductor device according to claim 12, wherein the memory element part is configured to output the analog data to an external circuit.

21. A unit comprising:
the semiconductor device according to claim 12; and
an input/output device configured to read out the analog data from the semiconductor device,
wherein the input/output device includes an analog/digital converter circuit.

22. The semiconductor device according to claim 12, wherein the analog data is an analog value of physical quantity or chemical quantity measured in an environment outside the semiconductor device.

* * * * *